(12) United States Patent
Ookubo et al.

(10) Patent No.: US 9,361,253 B2
(45) Date of Patent: Jun. 7, 2016

(54) SIGNAL CONTROL CIRCUIT, INFORMATION PROCESSING APPARATUS, AND DUTY RATIO CALCULATION METHOD

(71) Applicant: FUJITSU LIMITED, Kawasaki-shi, Kanagawa (JP)

(72) Inventors: Katsuhiko Ookubo, Kawasaki (JP); Michitaka Hashimoto, Kawasaki (JP); Noriyuki Tokuhiro, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 61 days.

(21) Appl. No.: 14/296,965

(22) Filed: Jun. 5, 2014

(65) Prior Publication Data
US 2015/0032950 A1 Jan. 29, 2015

(30) Foreign Application Priority Data

Jul. 26, 2013 (JP) ................................ 2013-156135

(51) Int. Cl.
*G11C 7/00* (2006.01)
*G06F 13/38* (2006.01)
*G11C 7/10* (2006.01)

(52) U.S. Cl.
CPC ............ *G06F 13/385* (2013.01); *G11C 7/1072* (2013.01)

(58) Field of Classification Search
None
See application file for complete search history.

(56) References Cited

U.S. PATENT DOCUMENTS

| 2009/0116315 | A1* | 5/2009 | Choi ........................ G11C 7/22 365/194 |
| 2009/0278580 | A1* | 11/2009 | Kim ...................... H03K 5/1254 327/158 |
| 2011/0062998 | A1* | 3/2011 | Mitsubori ............ G11C 7/1051 327/152 |
| 2012/0242385 | A1 | 9/2012 | Tokuhiro |

FOREIGN PATENT DOCUMENTS

| WO | WO03/001732 | 1/2003 |
| WO | WO2011/077573 | 6/2011 |

* cited by examiner

*Primary Examiner* — Gary Portka
(74) *Attorney, Agent, or Firm* — Staas & Halsey LLP

(57) ABSTRACT

A signal control circuit includes: a delay acquisition circuit configured to obtain a first delay amount to be added to an input signal for aligning timing of rise of the input signal with timing of fall or rise of a reference signal and a second delay amount to be added to the input signal for aligning timing of fall of the input signal with timing of the fall or the rise of the reference signal; and a ratio calculation circuit configured to calculate a duty ratio of the input signal based on a difference between the first delay amount and the second delay amount.

6 Claims, 17 Drawing Sheets

| PHASE INFORMATION | PHASE STATE |
|---|---|
| 00 | DELAYED |
| 01 | COINCIDENT |
| 11 | ADVANCED |
| 10 | ABNORMAL STATE |

| PHASE INFORMATION | PHASE STATE |
|---|---|
| 11 | DELAYED |
| 10 | COINCIDENT |
| 00 | ADVANCED |
| 01 | ABNORMAL STATE |

330

| SETTING VALUE FOR RISE - SETTING VALUE FOR FALL | DUTY RATIO (50+aX) |
|---|---|
| X>0 | LARGER THAN 50% |
| X=0 | 50% |
| X<0 | SMALLER THAN 50% |

| ACQUIRED EDGE | PHASE INFORMATION | EDGE SWITCHING SIGNAL |
|---|---|---|
| RISING | 01 | 0→1 |
| | OTHER THAN 01 | 0 HOLDING |
| FALLING | 10 | 1→0 |
| | OTHER THAN 01 | 1 HOLDING |

US 9,361,253 B2

SIGNAL CONTROL CIRCUIT, INFORMATION PROCESSING APPARATUS, AND DUTY RATIO CALCULATION METHOD

CROSS-REFERENCE TO RELATED APPLICATION

This application is based upon and claims the benefit of priority from the prior Japanese Patent Application No. 2013-156135 filed on Jul. 26, 2013, the entire contents of which are incorporated herein by reference.

FIELD

The embodiments discussed herein are related to a signal control circuit, an information processing apparatus and a duty ratio calculation method.

BACKGROUND

A memory controller includes a DDR memory interface circuit for DDR (Double Data Rate) 3 which is representative of DDR-based technology. DDR memory is a memory in which data is input and output on both positive and negative edges of a clock signal and transferred at a data transfer rate of twice the clock frequency.

In DDR memory technology, an internal clock signal generated within the memory controller is transmitted to a Dual In-line Memory Module (DIMM).

In addition, DIMM generates a data strobe DQS signal from the internal clock signal and sends the DQS signal together with a data DQ signal to the memory interface according to a read request from the memory controller.

The DQS signal and DQ signal are received at the memory interface side. Subsequently, the memory interface determines an optimum DQ signal capture timing based on phase information (edge) included in the received DQS signal. In addition, the memory controller captures the DQ signal at the determined timing.

The delay generated on a route along which the DQS signal or the DQ signal passes and on which, for example, a memory controller, a printed circuit board (PCB) or a memory element is located varies with the operational environment of a device such as, for example, a temperature or a power source voltage. Therefore, the timing at which the DQS signal and DQ signal arrive at the memory controller varies with the change of the operational environment of the device. Recently, as the data transfer rate is becoming increased, the influence of variation in delay is increasing.

There is a conventional technology in which the memory interface monitors the timing of DQS signal each time when a read operation is performed and adjusts the delay amount of a reception signal based on a result of the monitoring to cancel out the variation of the arrival timing in order to determine an optimum data capturing timing according to the variation in an arrival timing of signal. See, for example, International Publication No. WO2003/001732 and International Publication No. WO2011/077573.

However, as the speed of the memory interface has recently been increased as in the transition from DDR3 to DDR4, the timing margin for capturing the DQ signal using the DQS signal has been decreased. Further, the duty ratio of the DQS signal may experience a degradation in a period during which the DQS signal passes through, for example, a level converter, which performs a voltage level conversion from a voltage of an I/O power supply within the memory controller to a voltage of a Core power supply, or a signal transmission path.

In addition, since the timing margin for capturing the DQ signal is reduced due to the duty ratio degradation of the DQS signal, the reading timing may be out of the reduced timing margin in reading data by the memory interface. In this case, the memory interface may not accurately capture data and thus, a data abnormality may occur.

In particular, it is difficult to specify whether the data abnormality is caused by the duty ratio degradation because it is difficulty to observe the duty ratio degradation that has occurred within the memory interface.

The duty ratio degradation is not detected in a conventional technology in which the timing of the DQS signal is monitored to adjust a delay amount of the reception signal and thus, it is difficult to determine whether the data abnormality is caused by the duty ratio degradation.

SUMMARY

According to an aspect of the embodiments, a signal control circuit includes: a delay acquisition circuit configured to obtain a first delay amount to be added to an input signal for aligning timing of rise of the input signal with timing of fall or rise of a reference signal and a second delay amount to be added to the input signal for aligning timing of fall of the input signal with timing of the fall or the rise of the reference signal; and a ratio calculation circuit configured to calculate a duty ratio of the input signal based on a difference between the first delay amount and the second delay amount.

The object and advantages of the disclosure will be realized and attained by means of the elements and combinations particularly pointed out in the claims.

It is to be understood that both the foregoing general descriptions and the following detailed descriptions are exemplary and explanatory, and are not restrictive of the invention, as claimed.

BRIEF DESCRIPTION OF DRAWINGS

FIG. 3A is a view illustrating an example of a determination table for rise;

FIG. 3B is a view illustrating an example of a determination table for fall;

DESCRIPTION OF EMBODIMENTS

Hereinafter, exemplary embodiments of a signal control circuit, an information processing apparatus and a duty calculation method disclosed in the present disclosure will be described with reference to the drawings in detail. In the meantime, the signal control circuit, the information processing apparatus and the duty calculation method disclosed in the present disclosure are not limited to the following exemplary embodiments.

Figure 1:
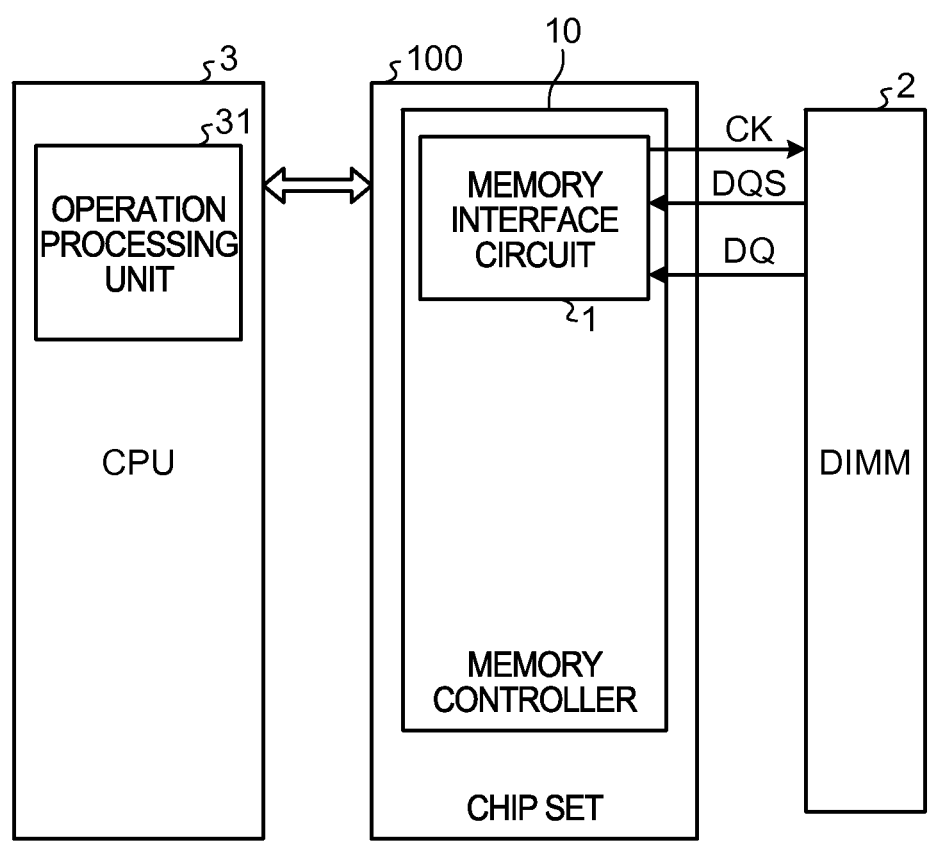
FIG. 1 is a view illustrating a schematic configuration of an information processing apparatus.

FIG. 1 is a view illustrating a schematic configuration of an information processing apparatus. The information processing apparatus according to the exemplary embodiment includes a chipset 100, a DIMM 2 and a CPU (Central Processing Unit) 3.

A memory controller 10 is installed in the chipset 100. In addition, the memory controller 10 includes a memory interface circuit 1.

The DIMM 2 is a storage device including a DRAM (Dynamic Random Access Memory) which is a storage. The DIMM 2 receives a read request of data and a clock signal from the memory interface circuit 1 to be described below. In addition, the DIMM 2 generates a data strobe DQS signal from the received clock signal. In addition, the DIMM 2 transmits the DQS signal along with a data DQ signal to the memory interface circuit 1.

The CPU 3 transmits a read request command which is an instruction to read data from the DIMM 2 to the memory controller 10 disposed on the chipset 100. In addition, the CPU 3 receives data designated by the read request from the memory controller 10. Then, the operation processing unit 31 of the CPU 3 executes a processing for the received data.

The memory controller 10 receives the read request command from the CPU 3. In addition, the memory controller 10 generates an internal clock signal and transmits the read request along with the generated internal clock signal to the memory interface circuit 1. Thereafter, the memory controller 10 acquires data captured by the memory interface circuit 1. In addition, the memory controller 10 transmits the acquired data to the CPU 3.

The memory interface circuit 1 receives the read request from the memory controller 10. Further, the memory interface circuit 1 receives the internal clock signal from the memory controller 10. In addition, the memory interface circuit 1 transmits a clock CK signal along with the read request to the DIMM 2.

Thereafter, the memory interface circuit 1 receives the data strobe DQS signal and the data DQ signal. Subsequently, the memory interface circuit 1 adds a delay to the DQS signal to be synchronized with the internal clock signal. Specifically, the memory interface circuit 1 adds the delay to the data strobe DQS signal so as to cause a rise of the DQS signal and a rise of a signal formed by adding a fixed delay to the DQS signal to be located before and after the fall of the internal clock signal, respectively. In addition, the memory interface circuit 1 captures data from the DQ signal at a timing of an edge of the DQS signal to which the delay is added. Thereafter, the memory interface circuit 1 transmits the captured data to the CPU 3.

Further, the memory interface circuit 1 according to the exemplary embodiment obtains the delay added to the DQS in a case where the phase of the rise of the DQS signal is aligned to the internal clock signal and the delay added to the DQS in a case where a phase of the fall of the DQS signal is aligned to that of the internal clock signal. In addition, the memory interface circuit 1 notifies each obtained delay to a device external to the memory controller 10, for example, the CPU 3. In addition, the CPU 3 calculates the duty ratio of the DQS signal using each delay obtained by the memory interface circuit 1 in the duty ratio calculation unit 14.

In this case, for example, the CPU 3 displays the duty ratio of the DQS signal on a monitor to notify the state of the duty ratio of the DQS signal to, for example, an operation manager of the information processing apparatus. Accordingly, the operation manager may identify the occurrence of the abnormality of a duty ratio immediately and thus, the causes of the abnormality may be quickly removed upon occurrence of the abnormality.

Figure 2:
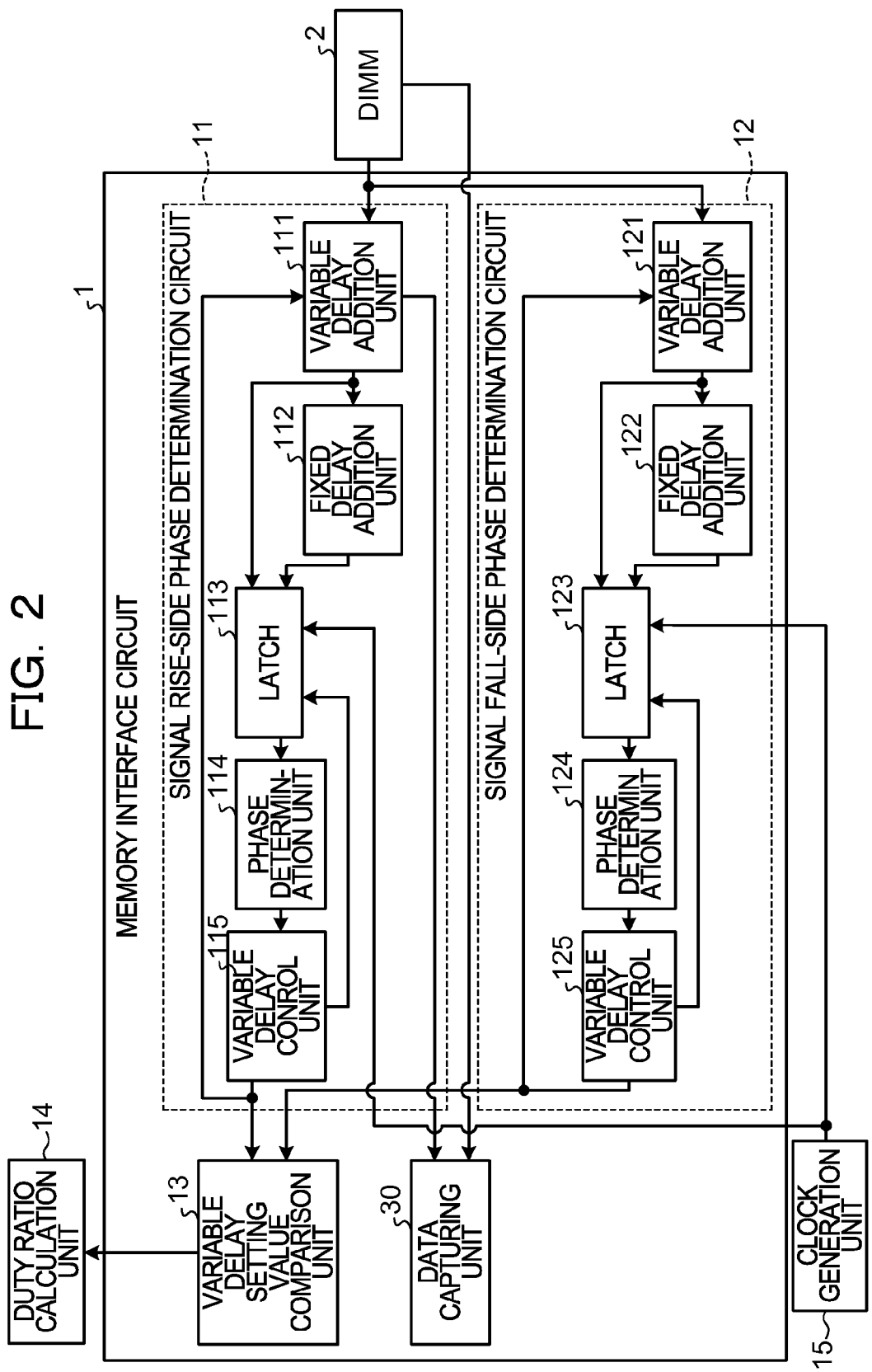
FIG. 2 is a view illustrating a memory interface circuit and an information processing apparatus according to an exemplary embodiment of the present disclosure.

Subsequently, the memory interface circuit 1 which performs the duty ratio calculation and the information processing apparatus according to the exemplary embodiment will be described in detail with reference to FIG. 2. FIG. 2 is a block diagram of a memory interface circuit and an information processing apparatus according to an exemplary embodiment of the present disclosure. In FIG. 2, respective components having a function, such as transmitting the CK signal to the DIMM 2 are omitted in order to explain the functionality of the duty ratio calculation.

As illustrated in FIG. 2, the memory interface circuit 1 according to the exemplary embodiment includes a signal rise-side phase determination circuit 11, a signal fall-side phase determination circuit 12, a variable delay setting value comparison unit 13 and a data capturing unit 30.

The signal rise-side phase determination circuit 11 is a circuit which obtains a delay amount for aligning a timing of the fall of the internal clock signal with that of the rise of the DQS signal. The data capturing unit 30 captures data from the DQ signal using the DQS signal to which the delay amount obtained by the signal rise-side phase determination circuit 11 is added. Subsequently, the details of the signal rise-side phase determination circuit 11 will be described.

The signal rise-side phase determination circuit 11 includes a variable delay addition unit 111, a fixed delay addition unit 112, a latch 113, a phase determination unit 114 and a variable delay control unit 115.

The variable delay addition unit 111 receives the DQS signal from the DIMM 2. Further, the variable delay addition unit 111 receives a variable delay setting value, which designates a delay amount to be added to the DQS signal, from the variable delay control unit 115. In addition, the variable delay addition unit 111 adds the delay amount, which amounts to several steps designated by the variable delay setting value, to the DQS signal. Here, a step refers to a unit of a predetermined delay amount to be added to the DQS signal. That is, the variable delay addition unit 111 receives the number of steps from the variable delay control unit 115 and adds a value obtained by multiplying the delay amount by the number of received steps to the DQS signal as a delay amount. In the following, the delay amount to be added to the DQS signal by the variable delay addition unit 111 is called the "variable delay amount for rise". Thereafter, the variable delay addition unit 111 outputs the DQS signal to which the variable delay amount for rise is given to the latch 113 and the fixed delay addition unit 112.

The fixed delay addition unit 112 receives an input of the DQS signal to which the variable delay amount for rise is added from the variable delay addition unit 111. In addition, the fixed delay addition unit 112 adds the predetermined delay amount to the DQS signal to which the variable delay amount for rise is added. In the following, the delay amount added to the DQS signal by the fixed delay addition unit 112 is called a "fixed delay amount for rise". Thereafter, the fixed delay addition unit 112 outputs the DQS signal to which the variable delay amount for rise and the fixed delay amount for rise are added to the latch 113.

The latch 113 receives an input of the DQS signal to which the variable delay amount for rise is given from the variable delay addition unit 111. Further, the latch 113 receives the DQS signal to which the variable delay amount for rise and the fixed delay amount for rise are added from the fixed delay addition unit 112. In the following, a signal output from the variable delay addition unit 111 is called the "advanced signal for rise" and a signal output from the fixed delay addition unit 112 is called the "delayed signal for rise".

Further, the latch 113 receives an input of the internal clock signal from a clock generation unit 15. Further, the latch 113 receives an input of an inhibition signal for rise (Inhibit: IH) from the variable delay control unit 115.

When the IH signal for rise is in a Low-level, the latch 113 captures the phase information of an advanced signal for rise and a delayed signal for rise at a timing of the fall of the internal clock signal. In the embodiment, when the signal is in a High-level, the latch 113 captures "1" as the phase information and otherwise, when the signal is in a Low-level, the latch 113 captures "0" as the phase information. For example, when the advanced signal for rise is in a High-level and the delayed signal for rise is Low at the fall timing of the internal clock signal, the latch 113 captures "1" as the phase information of the advanced signal for rise and captures "0" as the phase information of the delayed signal for rise.

In addition, the latch 113 outputs the phase information of the advanced signal for rise and the delayed signal for rise to the phase determination unit 114.

The phase determination unit 114 stores phase states which correspond to a combination of phase information. For example, the phase determination unit 114 stores the determination table for rise 201 illustrated in FIG. 3A. FIG. 3A is a view illustrating an example of a determination table for rise. In FIG. 3A, two numerals are enumerated in parallel as the phase information, where the first numeral indicates a value of the delayed signal for rise and the last numeral indicates a value of the advanced signal for rise.

The phase determination unit 114 receives the input of the phase information for the advanced signal for rise and the delayed signal for rise from the latch 113. In addition, the phase determination unit 114 acquires the phase state that corresponds to the combination of the received phase information from the determination table for rise 201. Thereafter, the phase determination unit 114 outputs the acquired phase state to the variable delay control unit 115. In the following, a phase state in which the phase of the DQS signal is delayed than that of the internal clock signal is called the "delayed phase state". Further, a phase state in which the phase of the DQS signal is advanced than that of the internal clock signal is called the "advanced phase state". Further, a phase state in which the phase of the DQS signal is coincident with that of the internal clock signal is called the "coincident phase state".

The variable delay control unit 115 receives an input of the phase state from the phase determination unit 114. In a case of the delayed phase state, the variable delay control unit 115 obtains a variable delay setting value which makes the phase of the DQS signal to advance by one step. That is, the variable delay control unit 115 set the number of steps obtained by subtracting one (1) from the number of steps notified to the variable delay addition unit 111 as the variable delay setting value. The variable delay control unit 115 transmits the obtained variable delay setting value to the variable delay addition unit 111.

Further, in a case of the advanced phase state, the variable delay control unit 115 obtains a variable delay setting value which makes the phase of the DQS signal to delay from the current phase of the DQS signal by one step. That is, the variable delay control unit 115 sets the number of steps obtained by adding one (1) to the number of steps notified to the variable delay addition unit 111 as the variable delay setting value. In addition, the variable delay control unit 115 transmits the obtained variable delay setting value to the variable delay addition unit 111.

Further, in a case of the coincident phase state, the variable delay control unit 115 transmits an instruction to hold the variable delay setting value to the variable delay addition unit 111. Further, the variable delay control unit 115 outputs the variable delay setting value notified to the variable delay addition unit 111 to the variable delay setting value comparison unit 13. Hereinafter, the variable delay setting value output from the variable delay control unit 115 is called the "setting value for rise". The setting value for rise corresponds to an example of a "first delay amount".

The signal fall-side phase determination circuit 12 is a circuit which obtains a delay amount for aligning a timing of the fall of the internal clock signal with that of the fall of the DQS signal.

The signal fall-side phase determination circuit 12 includes a variable delay addition unit 121, a fixed delay addition unit 122, a latch 123, a phase determination unit 124 and a variable delay control unit 125.

The variable delay addition unit 121 receives the DQS signal from the DIMM 2. Further, the variable delay addition unit 121 receives a variable delay setting value, which designates a delay amount to be added to the DQS signal, from the variable delay control unit 125. In addition, the variable delay addition unit 121 adds the delay amount designated by the variable delay setting value to the DQS signal. In the following, the delay amount added to the DQS signal by the variable delay addition unit 121 is called the "variable delay amount for fall". In addition, the variable delay addition unit 121 outputs the DQS signal to which the variable delay amount for fall is added to the latch 123 and the fixed delay addition unit 122.

The fixed delay addition unit 122 receives an input of the DQS signal to which the variable delay amount for fall is added from the variable delay addition unit 121. In addition, the fixed delay addition unit 122 adds the predetermined delay amount to the DQS signal to which the variable delay amount for fall is added. In the following, the delay amount added to the DQS signal by the fixed delay addition unit 122 is called the "fixed delay amount for fall". Thereafter, the fixed delay addition unit 122 outputs the DQS signal to which the variable delay amount for fall and the fixed delay amount for fall are added to the latch 123.

The latch 123 receives an input of the DQS signal to which the variable delay amount for fall is added from the variable delay addition unit 121. Further, the latch 123 receives the DQS signal to which the variable delay amount for fall and the fixed delay amount for fall are added from the fixed delay addition unit 122. In the following, a signal output from the variable delay addition unit 121 is called the "advanced signal for fall" and a signal output from the fixed delay addition unit 122 is called the "delayed signal for fall".

Further, the latch 123 receives an input of the internal clock signal from the clock generation unit 15. Further, the latch 123 receives an input of an inhibition signal IH for fall from the variable delay control unit 115.

When the IH signal for fall is in a Low-level, the latch 123 captures phase information of an advanced signal for fall and a delayed signal for fall at the timing of the fall of the internal clock signal.

In addition, the latch 123 outputs the phase information of the advanced signal for fall and the delayed signal for fall to the phase determination unit 124.

The phase determination unit 124 stores the phase states which correspond to a combination of phase information. For example, the phase determination unit 124 stores the determination table for fall 202 illustrated in FIG. 3B. FIG. 3B is a view illustrating an example of a determination table for fall.

The phase determination unit 124 receives an input of the phase information of the advanced signal for fall and the delayed signal for fall from the latch 123. In addition, the phase determination unit 124 acquires the phase state that corresponds to the combination of the received phase information from the determination table for fall 202. Thereafter, the phase determination unit 124 outputs the acquired phase state to the variable delay control unit 125.

The variable delay control unit 125 receives an input of the phase state from the phase determination unit 124. In a case of the delayed phase state, the variable delay control unit 125 obtains a predetermined variable delay setting value which makes the phase of the DQS signal to advance by one step. That is, the variable delay control unit 125 sets the number of steps obtained by subtracting one (1) from the number of steps notified to the variable delay addition unit 121 as the variable delay setting value. In addition, the variable delay control unit 125 transmits the obtained variable delay setting value to the variable delay addition unit 121.

Further, in a case of the advanced phase state, the variable delay control unit 125 obtains a predetermined variable delay setting value which makes the phase of the DQS signal delay from the current phase of the DQS signal by one step. That is, the variable delay control unit 125 sets the number of steps obtained by adding one (1) to the number of steps notified to the variable delay addition unit 121 as the variable delay setting value. In addition, the variable delay control unit 135 transmits the obtained variable delay setting value to the variable delay addition unit 121.

Further, in a case of the coincident phase state, the variable delay control unit 125 transmits an instruction to hold the variable delay setting value to the variable delay addition unit 121. Further, when the phases is coincident with each other, the variable delay control unit 125 outputs the variable delay setting to the variable delay setting value comparison unit 13. Hereinafter, the variable delay setting value output from the variable delay control unit 125 is called a "setting value for fall". The setting value for fall corresponds to an example of a "second delay amount".

The variable delay setting value comparison unit 13 receives an input of the setting value for rise from the variable delay control unit 115. Further, the variable delay setting value comparison unit 13 receives an input of the setting value for fall from the variable delay control unit 125.

The variable delay setting value comparison unit 13 obtains a difference between the setting value for rise and the setting value for fall. The variable delay setting value comparison unit 13 outputs the obtained difference between the setting value for rise and the setting value for fall to the duty ratio calculation unit 14. The signal rise-side phase determination circuit 11 and the signal fall-side phase determination circuit 12 described above correspond to an example of a "delay amount acquisition unit".

The duty ratio calculation unit 14 is implemented in, for example, the CPU 3 in FIG. 1. The duty ratio calculation unit 14 receives the difference between the setting value for rise and the setting value for fall from the variable delay setting value comparison unit 13.

Figure 4A:
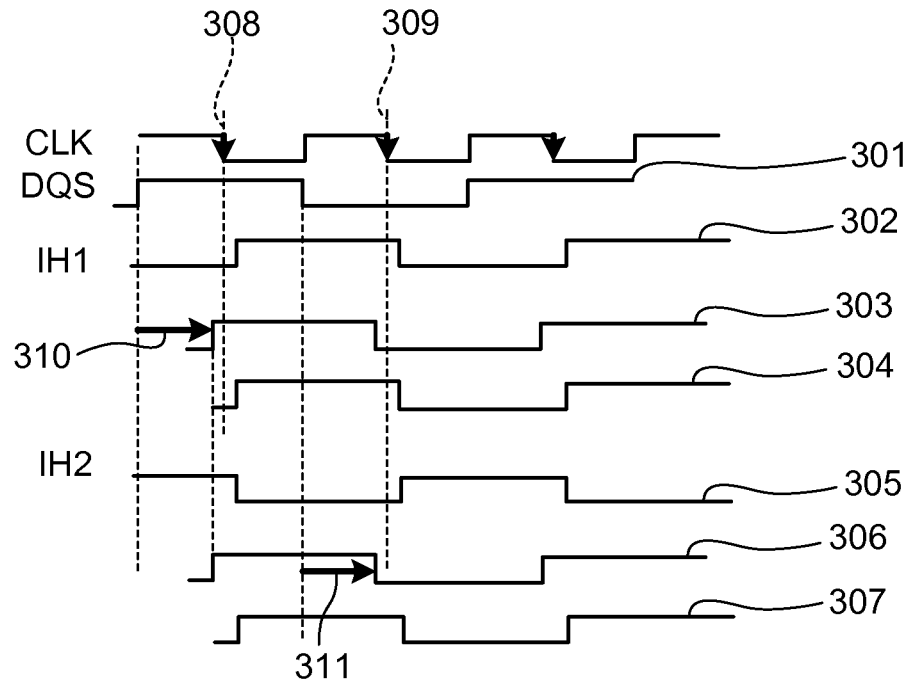
FIG. 4A is a view illustrating delay of both edges of a DQS signal in a case where a duty ratio is 50%.
Figure 4B:
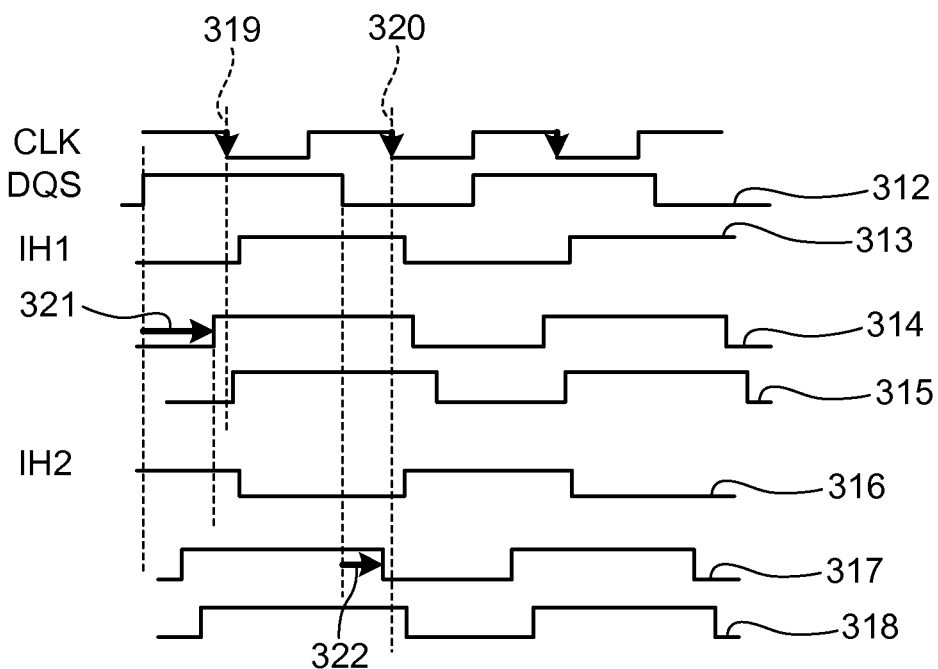
FIG. 4B is a view illustrating delay of both edges of the DQS signal in a case where a duty ratio is any other value than 50%.
Figures 5, 6:
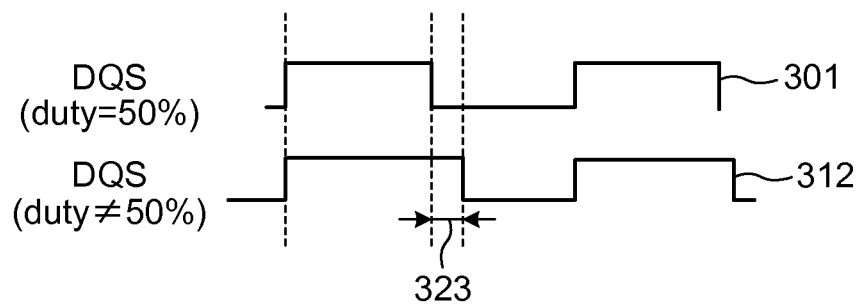
FIG. 5 is a view illustrating a relationship between the delay of both edges and a deviation amount of the duty ratio.
FIG. 6 is a view illustrating a relationship between the duty ratio calculated by a duty ratio calculation unit and a setting value for rise and a setting value for fall.

In addition, the duty ratio calculation unit 14 calculates the duty ratio of the DQS signal using the received difference between the setting value for rise and the setting value for fall. Hereinafter, descriptions will be made on a duty ratio calculation method by the duty ratio calculation unit 14 with reference to FIG. 4A, FIG. 4B and FIG. 5. FIG. 4A is a view illustrating delay of both edges of the DQS signal in a case where a duty ratio is 50%. FIG. 4B is a view illustrating the delay of both edges of the DQS signal in a case where a duty ratio is any other value than 50%. Further, FIG. 5 is a view illustrating the relationship between the delays of both edges and a variation amount of the duty ratio.

A signal 301 illustrated in FIG. 4A indicates the DQS signal in a case where the duty ratio is 50%. A signal 302 indicates an IH signal for rise. A signal 303 indicates an advanced signal for rise. A signal 304 indicates a delayed signal for rise. When the signal 302 is in a Low-level, values of the signal 303 and the signal 304 are acquired. That is, values of the signal 303 and the signal 304 are acquired at a timing 308.

Further, the signal 305 indicates the IH signal for fall. The signal 306 indicates the advanced signal for fall. The signal 307 indicates the delayed signal for fall. When the signal 305 is in a Low-level, values of the signal 306 and the signal 307 are acquired. That is, values of the signal 306 and the signal 307 are acquired at a timing 309.

In the embodiment, the period of the DQS signal is two times longer than that of the clock signal. Accordingly, when the duty ratio of the DQS signal is 50%, a delay 310 to be added to the signal 303 which is the advanced signal for rise is equivalent to a delay 311 to be added to the signal 306 which is the advanced signal for fall.

A signal 312 illustrated in FIG. 4B indicates the DQS signal in a case where the duty ratio is larger than 50%. A signal 313 indicates an IH signal for rise. A signal 314 indicates an advanced signal for rise. A signal 315 indicates a delayed signal for rise. When the signal 313 is in a Low-level, the values of the signal 314 and the signal 315 are acquired. That is, the values of the signal 314 and the signal 315 are acquired at a timing 319.

The signal 316 indicates the IH signal for fall. The signal 317 indicates the advanced signal for fall. The signal 318 indicates the delayed signal for fall. When the signal 316 is in a Low-level, the values of the signal 317 and the signal 318 are acquired. That is, the values of the signal 317 and the signal 318 are acquired at a timing 320.

When the duty ratio of the DQS signal is any other value than 50%, the delay 321 to be added to the signal 314 which is the advanced signal for rise is equivalent to the delay 322 to be added to the signal 317 which is the advanced signal for fall.

As illustrated in FIG. 5, a period 323 which is a difference between the signal 301 and the signal 312 becomes equal to a difference between the delay 321 added to the signal 314 and the delay 322 added to the signal 317.

In addition, the delay amount added to the DQS signal by the variable delay addition unit 111 and the variable delay addition unit 121 is calculated from the setting value for rise and the setting value for fall. That is, the delay 321 is a value obtained by multiplying the setting value for rise by the unit delay amount of 1 (one) step. Further, the delay 322 a value obtained by multiplying the setting value for fall of the unit delay amount by 1 (one) step.

Therefore, the duty ratio calculation unit 14 may obtain a difference between values obtained by multiplying the setting value for rise and the setting value for fall by the unit delay amount of 1 (one) step, respectively, to calculate the variation amount of the duty ratio of the DQS signal.

In addition, the duty ratio of the DQS signal is obtained by expressing a value, which is obtained by dividing the width of High-level portion of the DQS signal by the period of the DQS signal, as a percentage. Therefore, the duty ratio may be expressed as a function, that is, "duty ratio=50+aX", where the "X" indicates a difference between the setting value for rise and the setting value for fall. Here, the coefficient "a" is obtained by expressing a value, which is obtained by dividing the unit delay amount of 1 (one) step by a period of the DQS signal, as a percentage. That is, the duty ratio calculation unit 14 substitutes the difference between the setting value for rise and the setting value for fall into the "duty ratio=50+aX" to calculate the duty ratio.

A relationship between a setting value for rise and a setting value for fall and a duty ratio calculated by the duty ratio calculation unit 14 may be represented as a table 330 of FIG. 6. FIG. 6 is a view illustrating a relationship between the duty ratio calculated by the duty ratio calculation unit and the setting value for rise and the setting value for fall. As illustrated in the table 330, when X is larger than 0 (zero), the duty ratio is larger than 50%. That is, the width of a High-level portion is larger than that of a Low-level portion. When X is 0 (zero), the duty ratio is 50%. That is, the width of the High-level portion is equal to that of the Low-level portion. When X is less than 0 (zero), the duty ratio is less than 50%. That is, the width of the High-level portion is smaller than that of the Low-level portion.

A specific example will be described for a case where, for example, X is 3 (three), a period of the DQS signal is 1000 (one thousand) ps (picosecond), and the unit delay amount of 1 (one) step 1 is 20 ps. In this case, when the duty ratio is 50%, the width of the High-level portion of the DQS signal becomes 500 ps. Further, the coefficient "a" becomes a=(20/1000)×100=2. Therefore, in a case where the X is 3 (three), the duty ratio becomes 50+(2×3)=56%. As described above, the duty ratio calculation unit 14 calculates the duty ratio from the setting value for rise and the setting value for fall.

Descriptions will be continued by referring back to FIG. 2. The duty ratio calculation unit 14 may display the calculated duty ratio on a monitor to notify a current duty ratio to an operator of the information processing apparatus.

Figure 7:
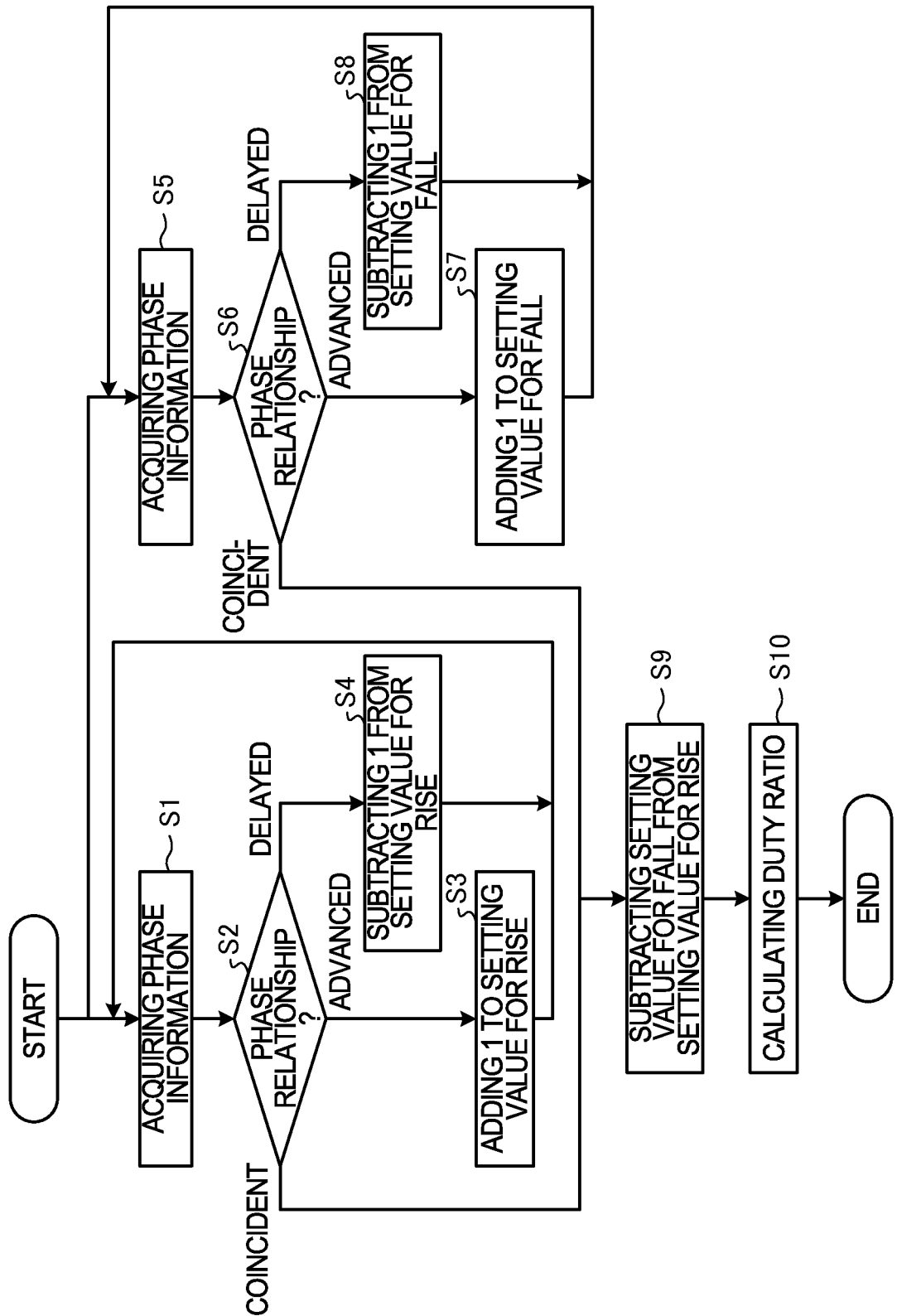
FIG. 7 is a view illustrating a duty ratio calculation processing operation by the memory interface circuit according to the exemplary embodiment illustrated in FIG. 2.

Subsequently, referring to FIG. 7, descriptions will be made on a flow of the duty ratio calculation process by a memory interface circuit according to the present embodiment. FIG. 7 is a view illustrating a duty ratio calculation processing operation by the memory interface circuit.

The latch 113 acquires phase information of the advanced signal for rise and the delayed signal for rise (Operation S1).

Subsequently, the phase determination unit 114 receives an input of the phase information of the advanced signal for rise and the delayed signal for rise from the latch 113. In addition, the phase determination unit 114 determines the phase state of the DQS signal from the phase information of the advanced signal for rise and delayed signal for rise. In addition, the phase determination unit 114 outputs the phase state of the DQS signal to the variable delay control unit 115.

The variable delay control unit 115 receives an input of the phase state of the DQS signal from the phase determination unit 114. In addition, the variable delay control unit 115 determines a relationship between a phase of the rise of the DQS signal and a phase of an internal clock CLK (Operation S2). When it is determined that the phases are coincident with each other (the determination result at Operation S2 is "Coincidence"), the variable delay control unit 115 outputs the setting value for rise to the variable delay setting value comparison unit 13.

In contrast, when it is determined that the phase of the rise of the DQS signal is advanced than that of the internal clock CLK (the determination result at Operation S2 is "Advanced"), the variable delay control unit 115 adds 1 (one) to the setting value for rise (Operation S3), and the processing operation returns to Operation S1. Further, when it is determined that phase of the rise of the DQS signal is delayed than that of the internal clock CLK (the determination result at Operation S2 is "Delayed"), the variable delay control unit 115 subtracts 1 (one) from the setting value for rise (Operation S4), and the processing operation returns to Operation S1.

In the meantime, the latch 123 acquires phase information of the advanced signal for fall and the delayed signal for fall (Operation S5).

Subsequently, the phase determination unit 124 receives an input of the phase information of the advanced signal for fall and the delayed signal for fall from the latch 123. In addition, the phase determination unit 124 determines a phase state of the DQS signal from the phase information of the advanced signal for fall and delayed signal for fall. In addition, the phase determination unit 124 outputs the phase state of the DQS signal to the variable delay control unit 125.

The variable delay control unit 125 receives an input of the phase state of the DQS signal from the phase determination unit 124. In addition, the variable delay control unit 125 determines a relationship between a phase of the fall of the DQS signal and a phase of the internal clock CLK (Operation S6). When it is determined that the phases are coincident with each other (the determination result at Operation S6 is "Coincidence"), the variable delay control unit 125 outputs the setting value for fall to the variable delay setting value comparison unit 13.

In contrast, when it is determined that phase of the fall of the DQS signal is advanced than that of the internal clock CLK (the determination result at Operation S6 is "Advanced"), the variable delay control unit 125 adds 1 (one) to the setting value for fall (Operation S7), and the processing operation returns to Operation S5. Further, when it is determined that phase of the fall of the DQS signal is delayed than that of the internal clock CK (the determination result at Operation S6 is "Delayed"), the variable delay control unit 125 subtracts 1 (one) from the setting value for fall (Operation S8), and the processing operation returns to Operation S5.

The variable delay setting value comparison unit 13 receives an input of the setting value for rise from the variable delay control unit 115 and receives an input of the setting value for fall from the variable delay control unit 125. In addition, the variable delay setting value comparison unit 13 obtains a difference between the setting value for rise and the setting value for fall (Operation S9). The variable delay setting value comparison unit 13 outputs the difference between the setting value for rise and the setting value for fall to the duty ratio calculation unit 14.

The duty ratio calculation unit 14 receives an input of the difference between the setting value for rise and the setting value for fall from the variable delay setting value comparison unit 13. In addition, the duty ratio calculation unit 14 calculates the duty ratio of the DQS signal using the received difference (Operation S10).

Figure 8:
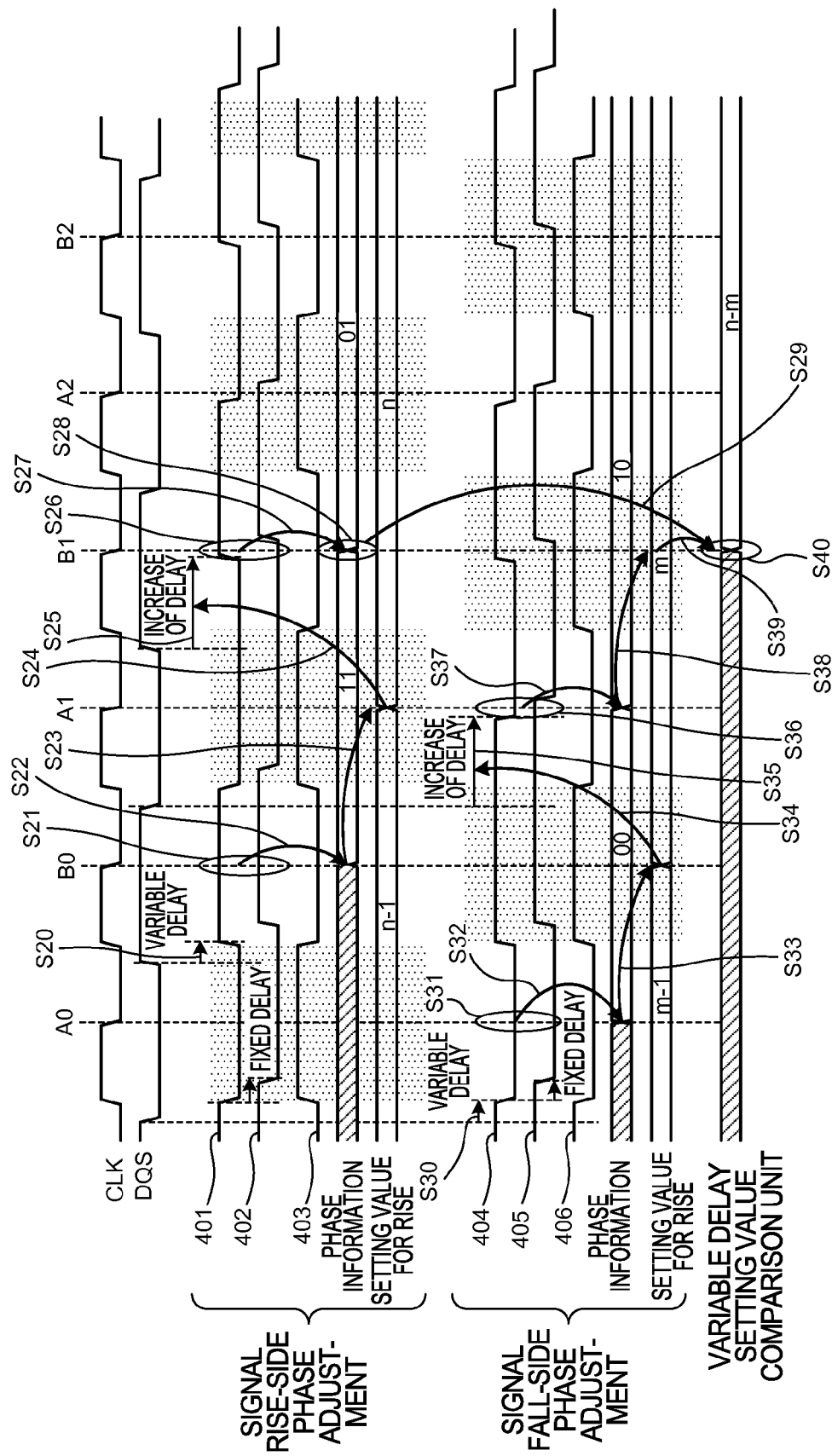
FIG. 8 is a timing chart illustrating a timing of the duty ratio calculation process in a case where the DQS signal is ahead of an internal clock signal in phase.

Subsequently, descriptions will be made on an overall flow of the duty ratio calculation process for a case where the phase of the DQS signal is advanced with respect to the internal clock CLK with reference to FIG. 8. FIG. 8 is a timing chart illustrating a timing of the duty ratio calculation process in a case where the DQS signal is ahead of an internal clock signal in phase.

A horizontal axis of FIG. 8 indicates a time lapse. Further, a signal 401 indicates an advanced signal for rise. Further, a signal 402 indicates a delayed signal for rise. Further, a signal 403 indicates an IH signal for rise. Further, a signal 404 indicates an advanced signal for fall. Further, a signal 405 indicates a delayed signal for fall. Further, a signal 406 indicates an IH signal for fall. When the IH signal for rise 403 is in a Low-level, values of the signal 401 and signal 402 are acquired. That is, the latch 113 acquires the values of the signal 401 and signal 402 at timings B0, B1 and B2. When the IH signal for fall 406 is in a Low-level, values of the signal 404 and signal 405 are acquired. That is, the latch 123 acquires the values of the signal 404 and signal 405 at timings A0, A1, and A2.

In a signal rise-side phase adjustment, the variable delay addition unit 111 adds a variable delay that amounts to the setting value for rise of "n−1" to the signal 401 (Operation S20). The signal 402 is a signal formed by adding a fixed delay to the signal 401

At timing B0, the latch 113 acquires the values of the signal 401 and the signal 402 (Operation S21). In this case, the latch 113 acquires "1" as the value of the signal 401 and acquires "1" as the value of the signal 402. The phase determination unit 114 receives a pair of phase information that is "11" from the latch 113 (Operation S22). Here, the first bit indicates the value of the delayed signal and the last bit indicates the value of the advanced signal in the number "11" which indicates the pair of phase information. In the following, the pair of phase information of the advanced signal and the delayed signal may be simply referred to as "phase information".

The phase determination unit 114 determines that the phase of the DQS signal is in an advanced phase state. In addition, the phase determination unit 114 notifies the variable delay control unit 115 that the phase of the DQS signal is in an advanced phase state (Operation S23). The variable delay control unit 115 adds 1 (one) to the setting value for rise to obtain a new setting value for rise. In FIG. 8, the variable delay control unit 115 adds 1 (one) to the setting value for rise of "n−1" to obtain a new setting value for rise of "n". In addition, the variable delay control unit 115 notifies the obtained setting value for rise to the variable delay addition unit 111 (Operation S24).

The variable delay addition unit 111 receives an input of the setting value for rise from the variable delay control unit 115 and adds a delay that the delay amount is increased by 1 (one) step to the DQS signal (Operation S25).

At timing B1, the latch 113 acquires the values of the signal 401 and the signal 402 (Operation S26). In this case, the latch 113 acquires "1" as the value of the signal 401 and acquires "0" as the value of the signal 402. The phase determination unit 114 receives a pair of phase information that is "01" from the latch 113 (Operation S27).

Since the phase information is "01", the phase determination unit 114 determines that the phase of the DQS signal is in a coincident phase state (Operation S28). In addition, the phase determination unit 114 notifies the variable delay control unit 115 that the DQS signal is in a coincident phase state. Since the phases are coincident with each other, the variable delay control unit 115 outputs the setting value for rise at the time of coincidence of the phases to the variable delay setting value comparison unit 13 (Operation S29).

In the meantime, in a signal fall-side phase adjustment, the variable delay addition unit 121 adds the variable delay that amounts to the setting value for fall of "m−1" to the signal 404 (Operation S30). The signal 405 is a signal formed by adding a fixed delay to the signal 404.

At timing A0, the latch 123 acquires the values of the signal 404 and the signal 405 (Operation S31). In this case, the latch 123 acquires "0" as the value of the signal 404 and acquires "0" as the value of the signal 405. The phase determination unit 124 receives a pair of phase information, that is "00", from the latch 123 (Operation S32).

The phase determination unit 124 determines that the phase of the DQS signal is in an advanced phase state. In addition, the phase determination unit 124 notifies the variable delay control unit 125 that the phase of the DQS signal is in an advanced phase state (Operation S33). The variable delay control unit 125 adds 1 (one) to the setting value for fall to obtain a new setting value for fall. In FIG. 8, the variable delay control unit 125 adds 1 (one) to the setting value for rise of "m−1" to obtain a new setting value for fall of "m". In addition, the variable delay control unit 125 notifies the obtained setting value for fall to the variable delay addition unit 121 (Operation S34).

The variable delay addition unit 121 receives an input of the setting value for fall from the variable delay control unit 125 and adds a delay that the delay amount is increased by 1 (one) step to the DQS signal (Operation S35).

At timing A1, the latch 123 acquires the values of the signal 404 and the signal 405 (Operation S36). In this case, the latch 123 acquires "0" as the value of the signal 404 and acquires "1" as the value of the signal 405. The phase determination unit 124 receives the phase information that is "10" from the latch 123 (Operation S37).

Since the phase information is "10", the phase determination unit 124 determines that the phase of the DQS signal is in a coincident phase state. In addition, the phase determination unit 124 notifies the variable delay control unit 125 that the DQS signal is in a coincident phase state (Operation S38). Since the phases are coincident with each other, the variable delay control unit 125 outputs the setting value for fall at the time of coincidence of the phases to the variable delay setting value comparison unit 13 (Operation S39).

Thereafter, the variable delay setting value comparison unit 13 obtains the difference between the setting value for rise and the setting value for fall (Operation S40).

Thereafter, the variable delay setting value comparison unit 13 notifies the obtained difference to the duty ratio calculation unit 14. The duty ratio calculation unit 14 calculates the duty ratio of the DQS signal using the received difference between the setting value for rise and the setting value for fall to notify the calculated duty ratio of the DQS signal to the operator.

Figure 9:
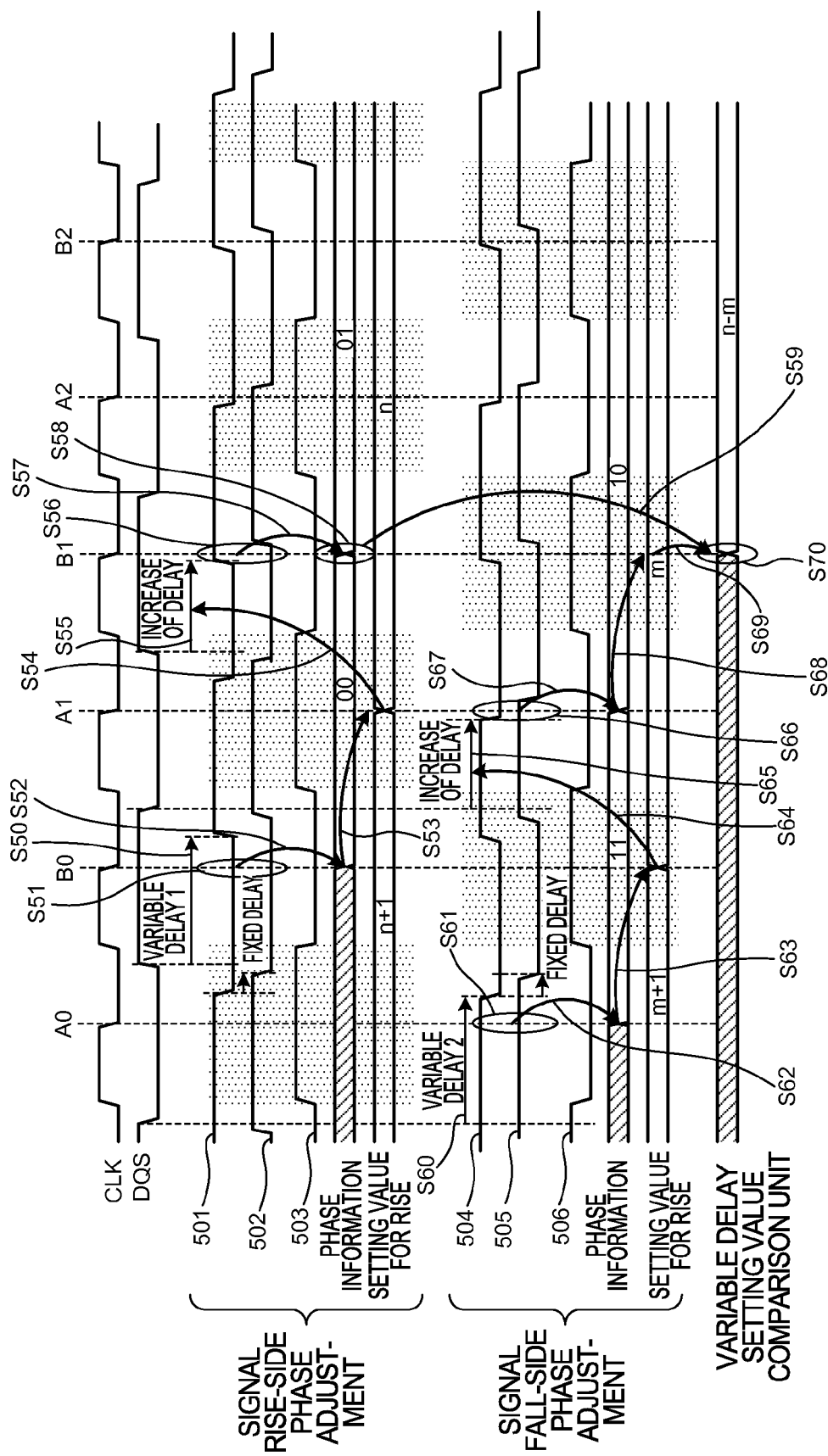
FIG. 9 is a timing chart illustrating the timing of the duty ratio calculation process in a case where the DQS signal is lagging behind the internal clock signal in phase.

Subsequently, descriptions will be made on an overall flow of the duty ratio calculation process for a case where the DQS signal is delayed with respect to the internal clock CLK with reference to FIG. 9. FIG. 9 is a timing chart illustrating a timing of the duty ratio calculation process in a case where the DQS signal is behind an internal clock signal in phase.

A horizontal axis of FIG. 9 indicates a time lapse. Further, a signal 501 indicates an advanced signal for rise. Further, a signal 502 indicates a delayed signal for rise. Further, a signal 503 indicates an IH signal for rise. Further, a signal 504 indicates an advanced signal for fall. Further, a signal 505 indicates a delayed signal for fall. Further, a signal 506 indicates an IH signal for fall. When the IH signal for rise 503 is in a Low-level, values of the signal 501 and signal 502 are acquired. That is, the latch 113 acquires the values of the signal 501 and signal 502 at timings B0, B1 and B2. When the IH signal for fall 506 is in a Low-level, values of the signal 504 and signal 505 are acquired. That is, the latch 123 acquires the values of the signal 504 and signal 505 at timings A0, A1, and A2.

In a signal rise-side phase adjustment, the variable delay addition unit 111 adds the variable delay that amounts to setting value for rise of "n+1" to the signal 501 (Operation S50). The signal 502 is a signal formed by adding a fixed delay to the signal 501.

At timing B0, the latch 113 acquires the values of the signal 501 and the signal 502 (Operation S51). In this case, the latch 113 acquires "0" as the value of the signal 501 and acquires "0" as the value of the signal 502. The phase determination unit 114 receives a pair of phase information that is "00" from the latch 113 (Operation S52).

The phase determination unit 114 determines that the phase of the DQS signal is in a delayed phase state. In addition, the phase determination unit 114 notifies the variable delay control unit 115 that the phase of the DQS signal is in a delayed phase state (Operation S53). The variable delay control unit 115 subtracts 1 (one) from the setting value for rise to obtain a new setting value for rise. In FIG. 9, the variable delay control unit 115 subtracts 1 (one) from the setting value for rise of "n+1" to obtain a new setting value for rise of "n". In addition, the variable delay control unit 115 notifies the obtained setting value for rise to the variable delay addition unit 111 (Operation S54).

The variable delay addition unit 111 receives an input of the setting value for rise from the variable delay control unit 115 and adds a delay that the delay amount is decreased by 1 (one) step to the DQS signal (Operation S55).

At timing B1, the latch 113 acquires the values of the signal 501 and the signal 502 (Operation S56). In this case, the latch 113 acquires "1" as the value of the signal 501 and acquires "0" as the value of the signal 502. The phase determination unit 114 receives a pair of phase information that is "01" from the latch 113 (Operation S57).

Since the phase information is "01", the phase determination unit 114 determines that the phase of the DQS signal is in a coincident phase state (Operation S58). In addition, the phase determination unit 114 notifies the variable delay control unit 115 that the DQS signal is in a coincident phase state. Since the phases are coincident with each other, the variable delay control unit 115 outputs the setting value for rise at the time of coincidence of the phases to the variable delay setting value comparison unit 13 (Operation S59).

In the meantime, in a signal fall-side phase adjustment, the variable delay addition unit 121 adds the variable delay that amounts to the setting value for fall of "m+1" to the signal 504 (Operation S60). The signal 505 is a signal formed by adding a fixed delay to the signal 504.

At timing A0, the latch 123 acquires the values of the signal 504 and the signal 505 (Operation S61). In this case, the latch 123 acquires "1" as the value of the signal 504 and acquires "1" as the value of the signal 505. The phase determination unit 124 receives a pair of phase information that is "11" from the latch 123 (Operation S62).

The phase determination unit 124 determines that the phase of the DQS signal is in a delayed phase state. In addition, the phase determination unit 124 notifies the variable delay control unit 125 that the phase of the DQS signal is in a delayed phase state (Operation S63). The variable delay control unit 125 subtracts 1 (one) from the setting value for fall to obtain a new setting value for fall. In FIG. 9, the variable delay control unit 125 subtracts 1 (one) from the setting value for fall of "m+1" to +obtain a new setting value for fall of "m". In addition, the variable delay control unit 125 notifies the obtained setting value for fall to the variable delay addition unit 121 (Operation S64).

The variable delay addition unit 121 receives an input of the setting value for fall from the variable delay control unit 125 and adds a delay that the delay amount is decreased by 1 (one) step to the DQS signal (Operation S65).

At timing A1, the latch 123 acquires the values of the signal 504 and the signal 505 (Operation S66). In this case, the latch 123 acquires "0" as the value of the signal 504 and acquires "1" as the value of the signal 505. The phase determination unit 124 receives the phase information that is "10" from the latch 123 (Operation S67).

Since the phase information is "10", the phase determination unit 124 determines that the phase of the DQS signal is in a coincident phase state. In addition, the phase determination unit 124 notifies the variable delay control unit 125 that the DQS signal is in a coincident phase state (Operation S68). Since the phases are coincident with each other, the variable delay control unit 125 outputs the setting value for fall at the time of coincidence of the phases to the variable delay setting value comparison unit 13 (Operation S69).

The variable delay setting value comparison unit 13 obtains the difference between the setting value for rise and the setting value for fall (Operation S70).

Thereafter, the variable delay setting value comparison unit 13 notifies the obtained difference to the duty ratio calculation unit 14. The duty ratio calculation unit 14 calculates the duty ratio of the DQS signal using the received difference between the setting value for rise and the setting value for fall to notify the calculated duty ratio of the DQS signal to the operator.

As described above, the memory interface circuit, which is a signal control circuit, according to the embodiment, obtains the setting value for fall for aligning the phase of the fall of the DQS signal with that of the fall of the internal clock signal, in addition to the setting value for rise for aligning the phase of the rise of the DQS signal to (with) that of the fall of the internal clock signal. In addition, the memory interface circuit obtains the duty ratio of the DQS signal from the difference between the setting value for rise and the setting value for fall. Accordingly, it becomes possible to measure the duty ratio according to an actual state of the DQS signal. Further, the operator may identify the degradation of the duty ratio immediately.

In the meantime, in the embodiment, a case where the phase information of the DQS signal is acquired at fall of the internal clock signal is described by way of an example, but the phase information acquisition timing of the DQS signal is not limited to the fall of the internal clock signal.

Further, a circuit which aligns the phase of the fall and obtains the delay amount at the time of aligning may be provided, in addition to a circuit for aligning the phase of the rise, to implement functionalities of the present disclosure. Therefore, a duty ratio measurement circuit may be installed while preventing increase in circuit scale.

Further, in the embodiment, the duty ratio calculation is performed by a device outside of the memory controller 10, but the duty ratio calculation is not limited thereto. The memory controller 10 may perform the duty ratio calculation using the same calculation equation and output the calculated and obtained duty ratio to outside of the memory controller 10.

Figure 10:
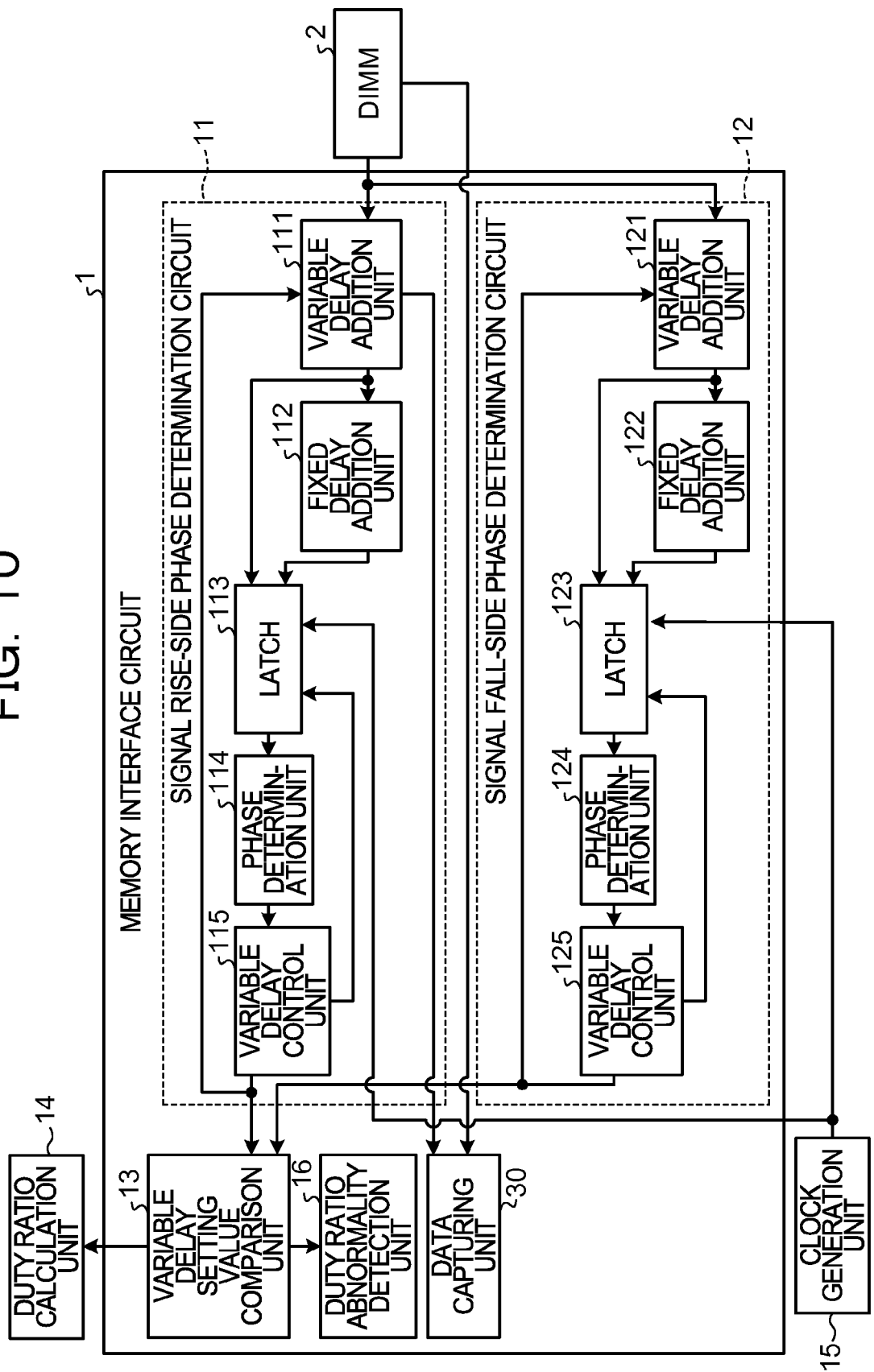
FIG. 10 is a view illustrating an information processing system including a memory interface circuit according to another exemplary embodiment of the present disclosure.

FIG. 10 is a block diagram illustrating an information processing system including a memory interface circuit according to another exemplary embodiment. The information processing system according to the present embodiment is different from the embodiment described in FIG. 2 in that the duty ratio abnormality is detected using the difference between the setting value for rise and the setting value for fall obtained in the memory interface circuit. In the following, descriptions regarding each component having the same functionality as that of the embodiment described in FIG. 2 will be omitted.

The memory interface circuit 1 according to the present embodiment further includes a duty ratio abnormality detection unit 16 as illustrated in FIG. 10, in addition to each component described in FIG. 2.

The variable delay setting value comparison unit 13 obtains the difference between the setting value for rise and the setting value for fall. In addition, the variable delay setting value comparison unit 13 notifies the difference between the setting value for rise and the setting value for fall to the duty ratio abnormality detection unit 16 in addition to the duty ratio calculation unit 14.

The duty ratio abnormality detection unit 16 receives the difference between the setting value for rise and the setting value for fall from the variable delay setting value comparison unit 13 as an input. In addition, the duty ratio abnormality detection unit 16 determines whether an absolute value of the difference exceeds a threshold for duty ratio abnormality determination. In the embodiment, the threshold for duty ratio abnormality determination is represented by the number of steps. Further, the threshold for duty ratio abnormality determination may be appropriately determined according to, for example, a timing margin for capturing the DQ signal using the DQS signal.

Figure 11A:
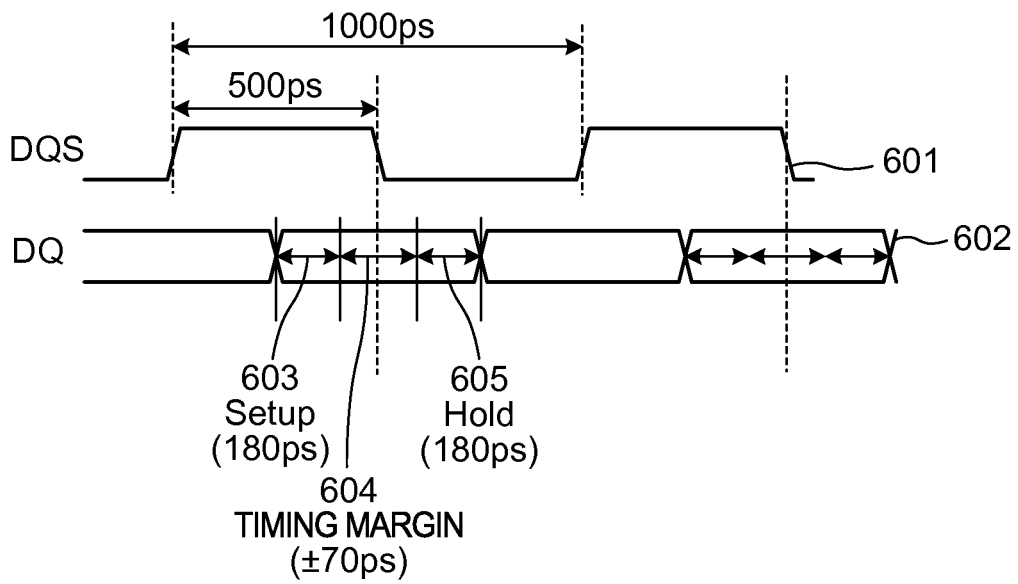
FIG. 11A is a view illustrating a data acquisition using the DQS signal having a duty ratio which is in a normal state.
Figure 11B:
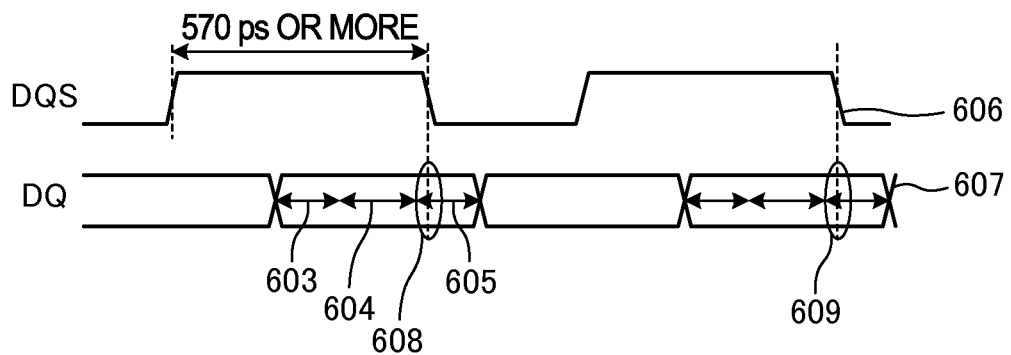
FIG. 11B is a view illustrating a data acquisition using the DQS signal having a duty ratio which is in a degraded state.

Here, an example of a determination method of the threshold for duty ratio abnormality determination will be described with reference to FIG. 11A and FIG. 11B. FIG. 11A is a view illustrating a data acquisition using the DQS signal having a duty ratio which is in a normal state. Further, FIG. 11B is a view illustrating a data acquisition using the DQS signal having a duty ratio which is in a degraded state. The horizontal axes of FIG. 11A and FIG. 11B indicate a time lapse. Further, the longitudinal axes of FIG. 11A and FIG. 11B indicate a signal level for the DQS signal.

Here, descriptions will be made on a case where a period of the DQS signal is 1000 ps, the unit delay of the variable delay is 20 ps, setup time of the latch 113 and latch 123 is 180 ps, a hold time is 180 ps, and a timing margin for capturing a signal is ±70 ps. The unit delay of the variable delay corresponds to a delay amount given at 1 (one) step. Further, the fact that the timing margin is ±70 ps indicates that when the duty ratio is 50%, an error occurs when the width of High-level portion is deviated ±70 ps or more.

In FIG. 11A, a signal 601 indicates the DQS signal and a signal 602 indicates the DQ signal. A setup period of the DQ signal corresponds to a period 603 spanning from the start of data to a time point of 180 ps in a signal propagation direction. Further, a hold period of the DQ signal corresponds to a period 605 spanning from the end of data to time point of 180 ps in a reverse direction. In addition, a period 604 excluding the period 603 and the period 605 corresponds to the timing margin. As illustrated in FIG. 11A, when the duty ratio is 50%, the DQS signal falls when 500 ps has elapsed. Data of the DQ signal is read at the falling timing of the DQ signal. In this case, the read timing corresponds to the middle of the timing margin and 70 ps width before and after the read timing is the timing margin.

In contrast, when the read timing is deviated 70 ps or more of the timing margin in a state where the duty ratio is normal, an error occurs. Here, in FIG. 11B, a signal 606 indicates a DQS signal having the degraded duty ratio and the signal 607 indicates a DQ signal. For example, as illustrated in FIG. 11B, when the width of High-level portion of the DQS signal becomes 570 ps or more, data is read at a timing 608. The timing 608 falls within the period of 605 and thus, when data is read at the timing 608, a hold error occurs. Similarly, the hold error occurs also when reading data at a timing 609. As described above, when deviation occurs from a timing at which the duty ratio is 50% by the absolute value or more of the timing margin at the read timing, an error occurs. Therefore, the number of steps obtained by dividing the absolute value of the timing margin by a delay corresponding to 1 (one) step may be determined as the threshold for duty ratio abnormality determination. Here, when dividing 70 ps by 20 ps, it becomes 3.5 (three point five). In order to reliably detect the duty ratio abnormality with which the likelihood of an error occurrence, the threshold for duty ratio abnormality determination is set as 3 (three) such that when the absolute value of the difference between the setting value for rise and the setting value for fall is 3 (three) steps or more, the duty ratio is determined as an abnormal duty ratio.

Figure 12:
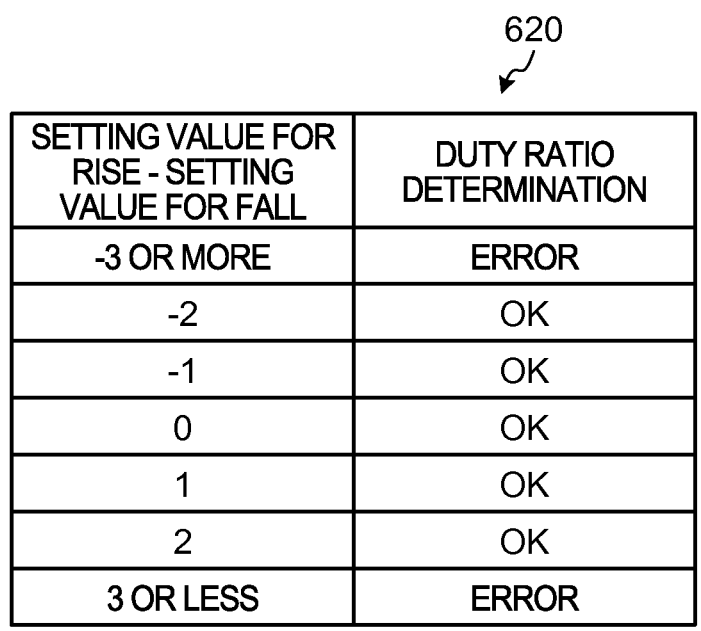
FIG. 12 is a view illustrating an example of a duty abnormality determination table.

In this case, the duty ratio abnormality detection unit 16 has, for example, a duty ratio abnormality determination table 620 as illustrated in FIG. 12. FIG. 12 is a view illustrating an example of the duty abnormality determination table. The duty ratio abnormality detection unit 16 acquires the difference between the setting value for rise and the setting value for fall and compares the acquired difference with the duty ratio abnormality determination table 620. In addition, when the difference is either +3 steps or more or −3 steps or less, the duty ratio abnormality detection unit 16 detects the duty ratio abnormality. Thereafter, the duty ratio abnormality detection unit 16 notifies the duty ratio abnormality to an external device, such as the CPU 3, of the memory controller 10.

As described above, the memory interface circuit, which is the signal control circuit according to the present embodiment, obtains the setting value for rise when the phase of the rise of the DQS signal is aligned with that of the fall of the internal clock signal and the setting value for fall when the phase of the fall of the DQS signal is aligned with that of the fall of the internal clock signal and detects the duty ratio abnormality from a difference between the setting value for rise and the setting value for fall. Accordingly, when an abnormality has occurred in the duty ratio, the duty ratio abnormality may be detected immediately. As a result, the cause whether the data abnormality is resulted from the duty ratio abnormality may be rapidly eliminated.

Figure 13:
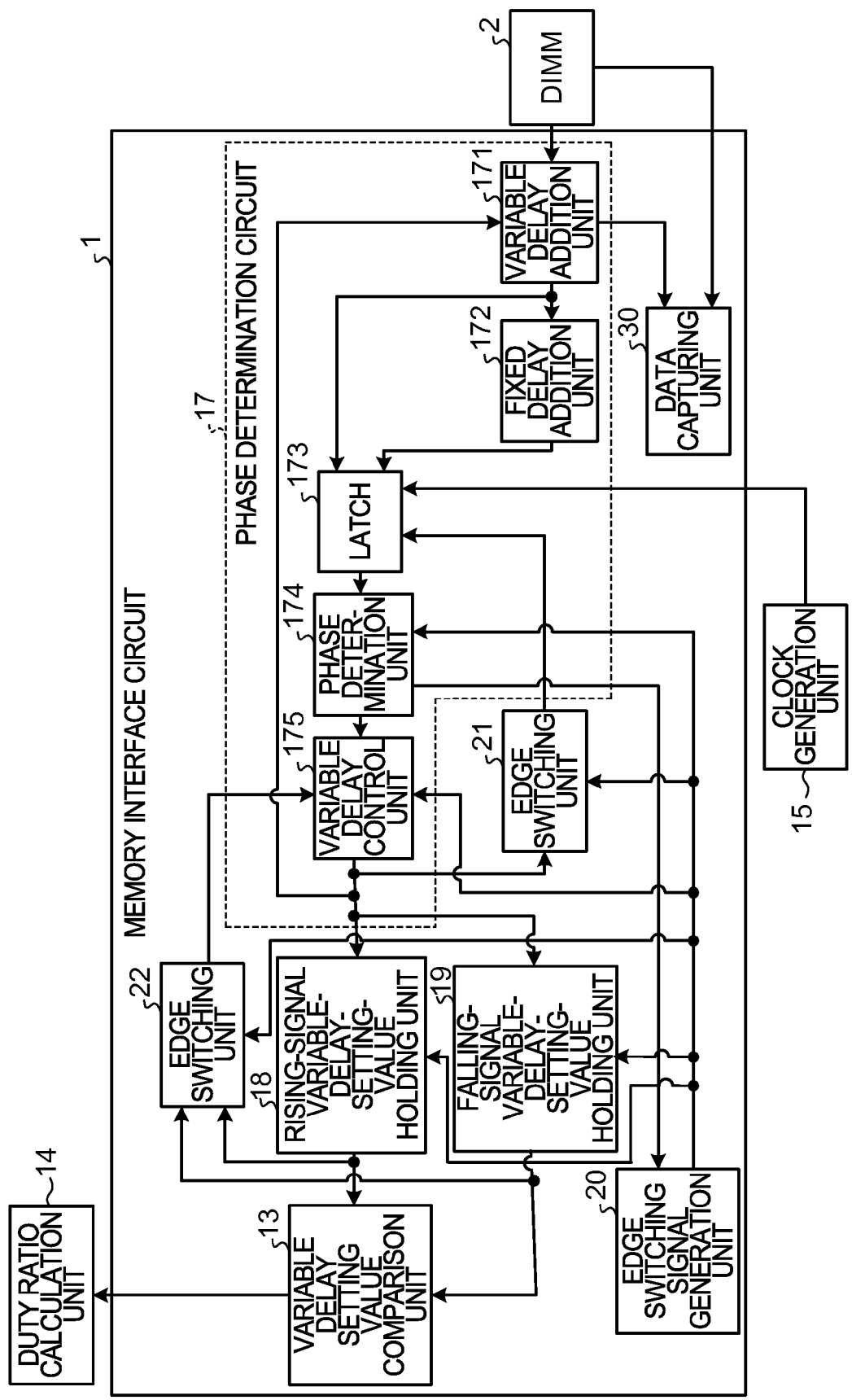
FIG. 13 is a view illustrating a memory interface circuit according to a third exemplary embodiment of the present disclosure.

FIG. 13 is a block diagram of the memory interface circuit. The difference between an information processing system according to the present embodiment and the embodiment described in FIG. 2 is that the setting value for rise and the setting value for fall are obtained using the same phase determination circuit. In the following description, descriptions on each component having the same functionality as that of the embodiment described in FIG. 2 will be omitted.

The phase determination circuit 17 is a circuit in which functionalities of the signal rise-side phase determination circuit 11 and the fall side phase determination circuit 12 in FIG. 2 are incorporated. When outlining operations, the phase determination circuit 17 first performs the same operation as that of the signal rise-side phase determination circuit 11 to obtain the setting value for rise and subsequently performs the same operation as that of the signal fall-side phase determination circuit 12 to obtain the setting value for fall. The operations of the phase determination circuit 17 will be described in detail below.

The phase determination circuit 17 includes a variable delay addition unit 171, a fixed delay addition unit 172, a latch 173, a phase determination unit 174, and a variable delay control unit 175.

The variable delay addition unit 171 performs the same operations as those of the variable delay addition unit 111 and the variable delay addition unit 121 in FIG. 2.

The fixed delay addition unit 172 performs the same operations as those of the fixed delay addition unit 112 and the fixed delay addition unit 122 in FIG. 2.

When performing a phase determination for rise, the latch 173 receives an input of the IH signal for rise from the edge switching unit 21. In addition, the latch 173 performs the same operation as the latch 113 in FIG. 2. Further, when performing a phase determination for signal fall, the latch 173 receives an input of the IH signal for fall from the edge switching unit 21. In addition, the latch 173 performs the same operation as the latch 123 in FIG. 2.

When performing a phase determination for rise, the phase determination unit 174 receives an edge switching signal for performing the phase determination using a rising edge from the edge switching signal generation unit 20. In this case, the phase determination unit 174 performs the same operation as the phase determination unit 114 in FIG. 2. Further, when performing a phase determination for signal fall, the phase determination unit 174 receives an edge switching signal for performing the phase determination using a falling edge from the edge switching signal generation unit 20. In this case, the phase determination unit 174 performs the same operation as the phase determination unit 124 in FIG. 2.

Further, the phase determination unit 174 outputs the obtained phase information to the edge switching signal generation unit 20.

When performing the phase determination for rise, the variable delay control unit 175 receives an edge switching signal for performing the phase determination using a rising edge from the edge switching signal generation unit 20. Further, when performing the phase determination for rise, the variable delay control unit 175 receives the setting value for rise from the edge switching unit 22 as a variable delay setting value to be returned to the variable delay addition unit 171. In this case, the variable delay control unit 175 obtains the variable delay setting value in the phase determination process for rise in the same manner as the variable delay control unit 115 in FIG. 2. The variable delay control unit 175 stores the obtained variable delay setting value in the phase determination process for rise in the rising-signal variable-delay-setting-value holding unit 18 in such a manner that the previously obtained variable delay setting value is sequentially overwritten by the newly obtained variable delay setting value. Thereafter, when the phase of the rise of the DQS signal is coincident with the internal clock signal, the variable delay control unit 175 outputs notification that calculation of the setting value for rise is completed to the rising-signal variable-delay-setting-value holding unit 18.

Further, when performing a phase determination for signal fall, the variable delay control unit 175 receives an edge switching signal for performing the phase determination using a falling edge from the edge switching signal generation unit 20. Further, when performing a phase determination for signal fall, the variable delay control unit 175 receives the setting value for fall from the edge switching unit 22 as a variable delay setting value to be returned to the variable delay addition unit 171. In this case, the variable delay control unit 175 obtains the variable delay setting value in the phase determination process for signal fall in the same manner as the variable delay control unit 125 in FIG. 2. The variable delay control unit 175 stores the obtained variable delay setting value in the phase determination process for signal fall in the falling-signal variable-delay-setting-value holding unit 19 in such a manner that the previously obtained variable delay setting value is sequentially overwritten by the newly obtained variable delay setting value. Thereafter, when the phase of the fall of the DQS signal is coincident with the internal clock signal, the variable delay control unit 175 outputs notification that calculation of the setting value for fall is completed to the falling-signal variable-delay-setting-value holding unit 19.

The edge switching unit 21 receives an input of the IH signal from the variable delay control unit 175. The received IH signal is the same as the IH signal for rise in the embodiment described in FIG. 2.

Further, when performing a phase determination for rise, the edge switching unit 21 receives an edge switching signal for performing the phase determination using a rising edge from the edge switching signal generation unit 20. In this case, the edge switching unit 21 outputs the IH received from the variable delay control unit 175 to the latch 173.

Further, when performing a phase determination for signal fall, the edge switching unit 21 receives an edge switching signal for performing the phase determination using a falling edge from the edge switching signal generation unit 20. In this case, the edge switching unit 21 inverts the IH received from the variable delay control unit 175 to generate the IH signal which is the same as the IH signal for fall in the embodiment described in FIG. 2. In addition, the edge switching unit 21 outputs the generated IH to the latch 173.

When performing the phase determination for rise, the rising-signal variable-delay-setting-value holding unit 18 receives an edge switching signal for performing the phase determination using a rising edge from the edge switching signal generation unit 20. In addition, the rising-signal variable-delay-setting-value holding unit 18 receives the variable delay setting value in the phase determination for rise from the variable delay control unit 175 to store the variable delay setting value in such a manner that the previously obtained variable delay setting value is sequentially overwritten by the newly obtained variable delay setting value.

In addition, the rising-signal variable-delay-setting-value holding unit 18 receives notification that calculation of the setting value for rise is completed from the variable delay control unit 175. In this case, the rising-signal variable-delay-setting-value holding unit 18 outputs the variable delay setting value to be stored to the variable delay setting value comparison unit 13 as a setting value for rise.

When performing a phase determination for signal fall, the falling-signal variable-delay-setting-value holding unit 19 receives an edge switching signal for performing the phase determination using a falling edge from the edge switching signal generation unit 20. The falling-signal variable-delay-setting-value holding unit 19 receives the variable delay setting value in the phase determination for signal fall from the variable delay control unit 175 to store the variable delay setting value in such a manner that the previously obtained variable delay setting value is sequentially overwritten by the newly obtained variable delay setting value.

In addition, the falling-signal variable-delay-setting-value holding unit 19 receives notification that calculation of the setting value for fall is completed from the variable delay control unit 175. In this case, the falling-signal variable-delay-setting-value holding unit 19 outputs the variable delay setting value to be stored to the variable delay setting value comparison unit 13.

Further, when performing the phase determination for rise, the edge switching unit 22 receives an edge switching signal for performing the phase determination using a rising edge from the edge switching signal generation unit 20. In this case, the edge switching unit 22 acquires the variable delay setting value in the current phase determination process for rise from the rising-signal variable-delay-setting-value holding unit 18. The edge switching unit 22 outputs the acquired variable delay setting value to the variable delay control unit 175 as the variable delay setting value to be returned to the variable delay addition unit 171.

Further, when performing a phase determination for signal fall, the edge switching unit 22 receives an edge switching signal for performing the phase determination using a falling edge from the edge switching signal generation unit 20. In this case, the edge switching unit 22 acquires the variable delay setting value in the current phase determination process for signal fall from the falling-signal variable-delay-setting-value holding unit 19. The edge switching unit 22 outputs the acquired variable delay setting value to the variable delay control unit 175 as the variable delay setting value to be returned to the variable delay addition unit 171.

The variable delay setting value comparison unit 13 receives an input of the setting value for rise from the rising-signal variable-delay-setting-value holding unit 18. Further, the variable delay setting value comparison unit 13 receives an input of the setting value for fall from the falling-signal variable-delay-setting-value holding unit 19. Thereafter, the variable delay setting value comparison unit 13 performs the same operations as in the embodiment described in FIG. 2 to obtain the difference between the setting value for rise and the setting value for fall and outputs the obtained difference to the duty ratio calculation unit 14.

The edge switching signal generation unit 20 receives an input of the phase information from the phase determination unit 174. When the input of the phase information reaches a predetermined condition, the edge switching signal generation unit outputs the signal for switching an edge used for the phase determination to the phase determination unit 174, the variable delay control unit 175, the rising-signal variable-delay-setting-value holding unit 18, the falling-signal variable-delay-setting-value holding unit 19, the edge switching unit 21 and the edge switching unit 22. In the following, an example of generation of an edge switching signal by the edge switching signal generation unit 20 will be described.

Figures 14A, 14B:
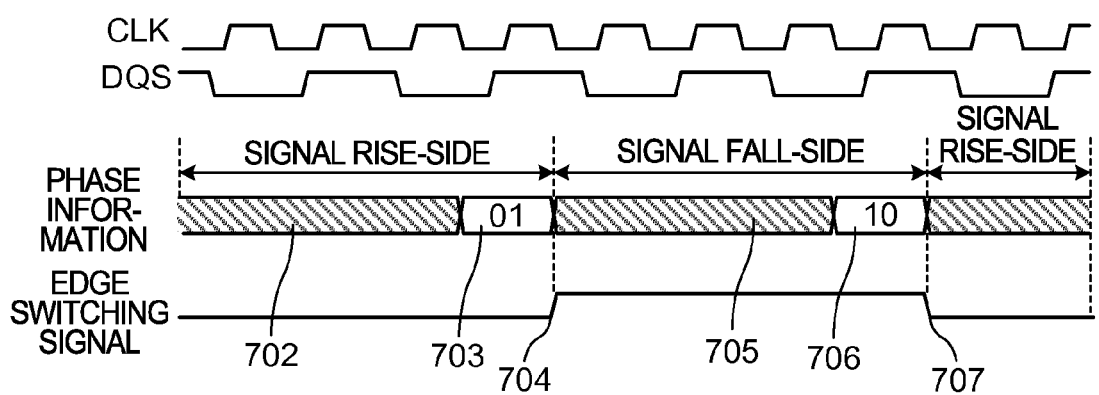
FIG. 14A is a view illustrating a condition determination in an exemplary edge switching signal generation method.
FIG. 14B is a timing chart illustrating a timing of the exemplary edge switching signal generation method.

FIG. 14A is a view illustrating a condition determination in an exemplary edge switching signal generation method. Further, FIG. 14B is a timing chart of the exemplary edge switching signal generation method.

In an edge switching signal field in the table 701 of FIG. 14A, a value of the edge switching signal which is "0" indicates that a rising edge is used for the phase determination. Further, in an edge switching signal field in the table 701, a value of the edge switching signal which is "1" indicates that a falling edge is used for the phase determination. Further, the first bit indicates the phase information of the delayed signal and the last bit indicates the phase information of the advanced signal in a pair of two numbers in parallel in the phase information of the table 701. Here, a pair of phase information of the advanced signal and the delayed signal may be called the "phase information".

In a state where the phase determination for rise is performed, when the phase information becomes "01", the edge switching signal generation unit 20 changes the value of the edge switching signal from "0" to "1", as illustrated in the table 701 of FIG. 14A. Further, in a state where the phase determination for rise is performed, when the phase information becomes "other than 01", the edge switching signal generation unit 20 holds the value of the edge switching signal "0" as it is. In a state where the phase determination for signal fall is performed, when the phase information becomes "10", the edge switching signal generation unit 20 changes the value of the edge switching signal from "1" to "0". Further, in a state where the phase determination for signal fall is performed, when the phase information becomes "other than 10", the edge switching signal generation unit 20 holds the value of the edge switching signal "1" as it is.

The changing of the edge switching signal caused by changing of the phase information will be described with reference to FIG. 14B. The timing chart of FIG. 14B begins with a case where the phase determination for rise is performed first. In a period 702, the phase information is "other than 01". In this case, the edge switching signal generation unit 20 outputs the edge switching signal having a value of "0". In addition, the phase information is changed to "01" at timing 703. In this case, the edge switching signal generation unit 20 changes the value of the edge switching signal from "0" to "1" at timing 704. Subsequently, in a period 705, the phase information is "other than 10". In this case, the edge switching signal generation unit 20 outputs the edge switching signal having a value of "1". In addition, the phase information is changed to "10" at timing 706. In this case, the edge switching signal generation unit 20 changes the value of the edge switching signal from "1" to "0" at timing 707.

Figure 15:
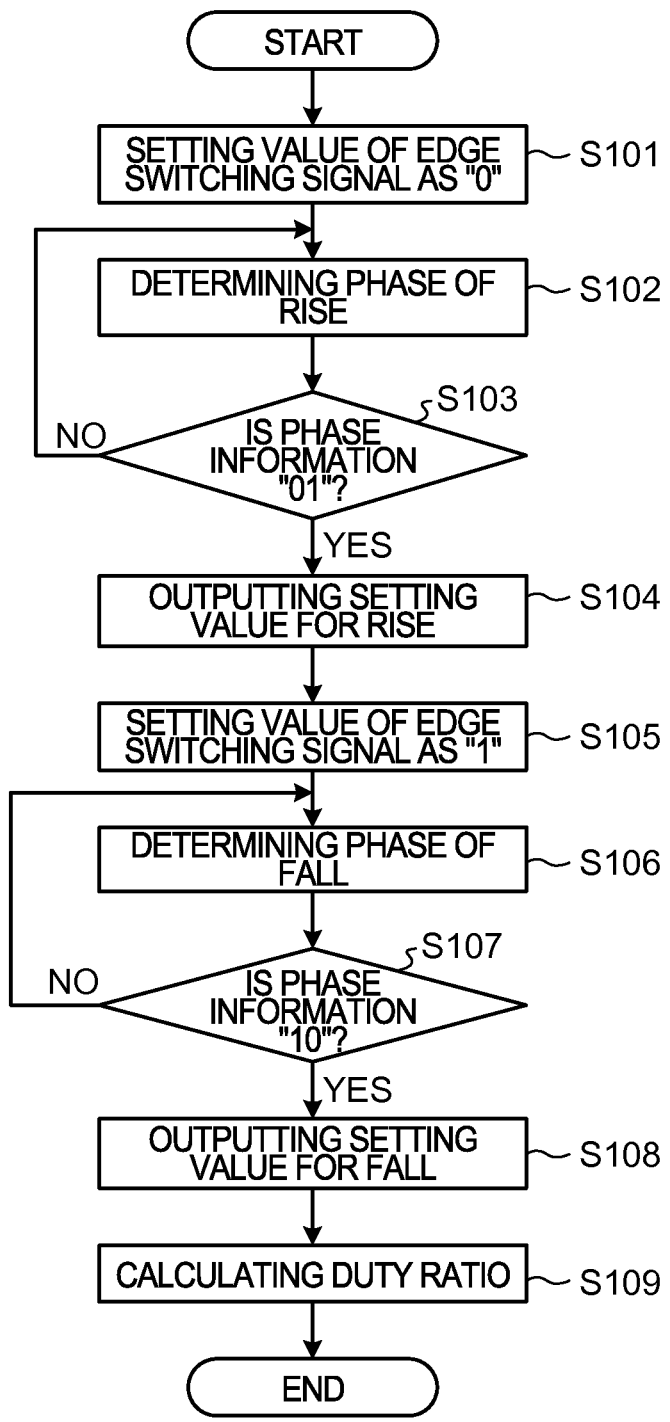
FIG. 15 is a view illustrating a duty ratio calculation processing operation when the exemplary edge switching signal generation method is used.

Subsequently, the flow of the duty ratio calculation process using an example of generation of the edge switching signal will be described with reference to FIG. 15. FIG. 15 is a view illustrating a duty ratio calculation processing operation using the exemplary edge switching signal generation method.

The edge switching signal generation unit 20 set the value of the edge switching signal as "0" (Operation S101).

The phase determination circuit 17 performs the phase determination using the rise (Operation S102).

The edge switching signal generation unit 20 receives an input of the phase information from the phase determination unit 174. In addition, the edge switching signal generation unit 20 determines whether the phase information is "01" (Operation S103). When it is determined that the phase information is not "01" (the determination result at Operation S103 is "NO"), the edge switching signal generation unit 20 goes back to Operation S102.

In contrast, when it is determined that the phase information is "01" (the determination result at Operation S103 is "YES"), the rising-signal variable-delay-setting-value holding unit 18 outputs the setting value for rise to the variable delay setting value comparison unit 13 (Operation S104).

The edge switching signal generation unit 20 changes the value of the edge switching signal to "1" (Operation S105).

The phase determination circuit 17 performs the phase determination using the fall (Operation S106).

The edge switching signal generation unit 20 receives an input of the phase information from the phase determination unit 174. In addition, the edge switching signal generation unit 20 determines whether the phase information is "10" (Operation S107). When it is determined that the phase information is not "10" (the determination result at Operation S107 is "NO"), the edge switching signal generation unit 20 goes back to Operation S106.

In contrast, when it is determined that the phase information is "10" (the determination result at Operation S107 is "YES"), the falling-signal variable-delay-setting-value holding unit 19 outputs the setting value for fall to the variable delay setting value comparison unit 13 (Operation S108).

In addition, the variable delay setting value comparison unit 13 obtains the difference between the setting value for rise and the setting value for fall and outputs the obtained difference to the duty ratio calculation unit 14. The duty ratio calculation unit 14 calculates the duty ratio of the DQS signal (Operation S109) and notifies the calculated duty ratio to an operator.

Subsequently, another example of the edge switching signal generation method will be described. In this example, when the phase information is input a predetermined number of times, the edge switching signal generation unit 20 switches the edge used for the phase determination. For example, when the phase information is input 100 (one hundred) times, the edge switching signal generation unit 20 changes the edge switching signal from an edge switching signal having a value of "0" indicating that the rise is used for the phase determination to an edge switching signal having a value of "1" indicating that the fall is used for the phase determination.

Figure 16:
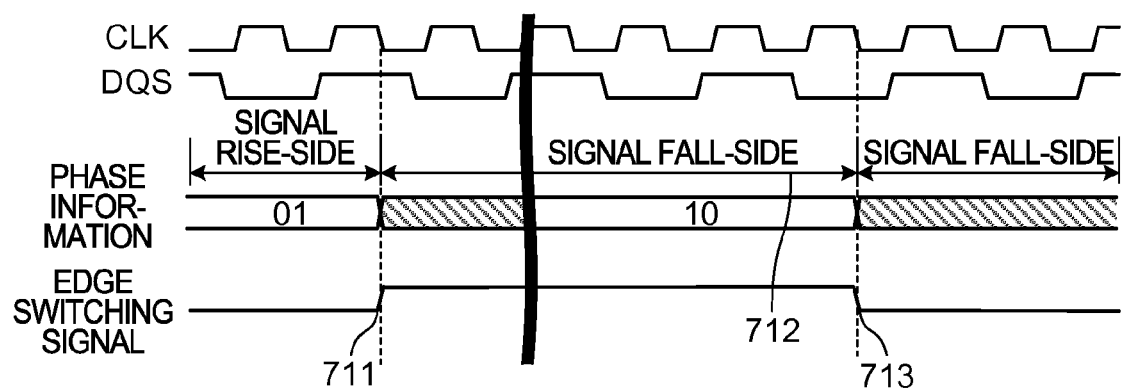
FIG. 16 is a timing chart illustrating a timing of another exemplary edge switching signal generation method.

FIG. 16 is a timing chart illustrating another exemplary edge switching signal generation method. For example, the edge switching signal generation unit 20 changes the value of the edge switching signal from "0" to "1" at timing 711. In addition, the edge switching signal generation unit 20 counts up the number of times that the phase information is received. The edge switching signal generation unit 20 outputs the edge switching signal which has a value of "1" until the number of times that the phase information is received reaches 100 (one hundred) times. When the number of times that the phase information is received reaches 100 (one hundred) times in a period 712, the edge switching signal generation unit 20 changes the value of the edge switching signal from "1" to "0" at timing 713. The edge switching signal generation unit 20 repeats the process until the phases of the rise and fall of the DQS signal are coincident with those of the internal clock signal, respectively.

Figure 17:
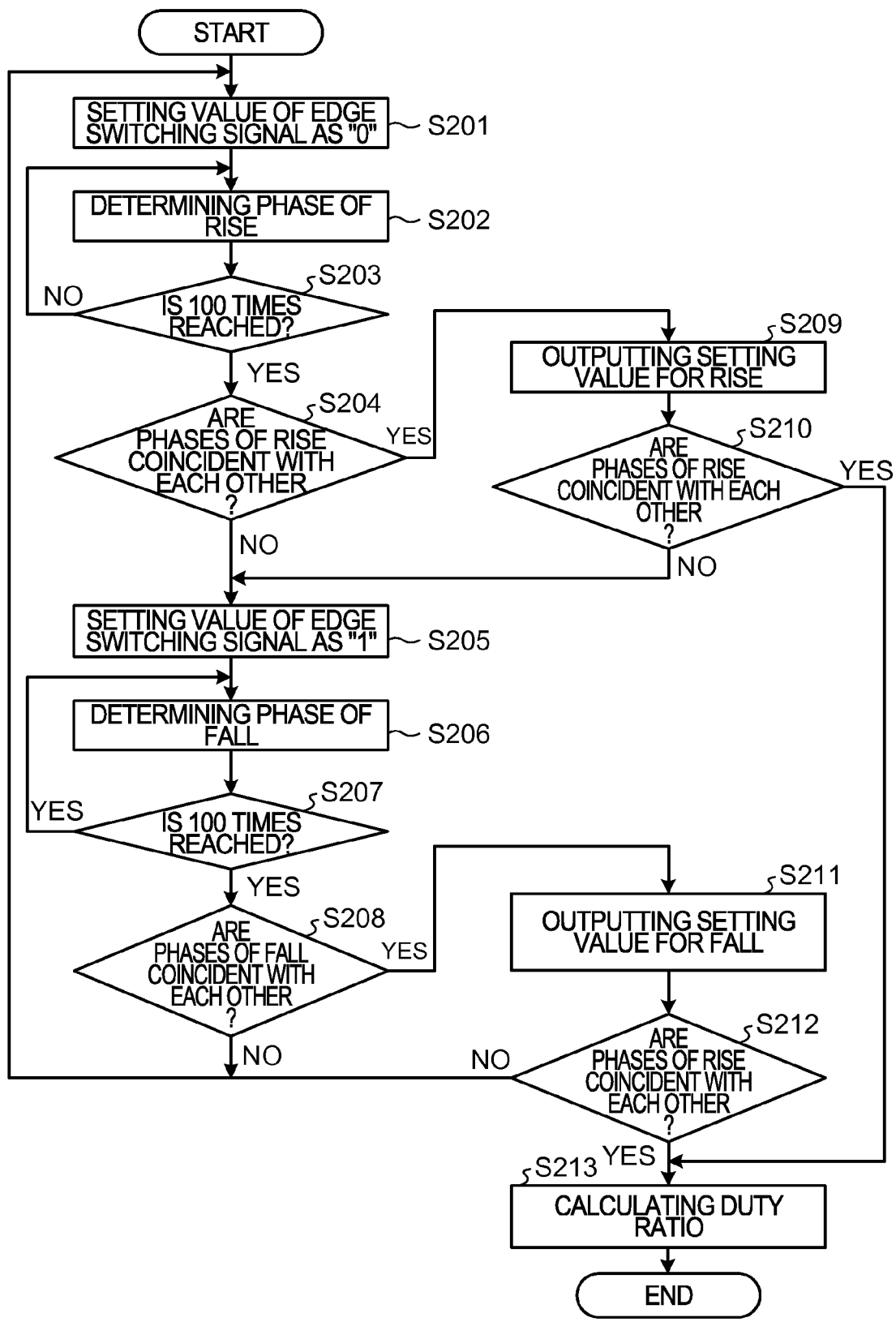
FIG. 17 is a view illustrating a duty ratio calculation processing operation when another exemplary edge switching signal generation method is used.

Subsequently, descriptions will be made on a flow of the duty ratio calculation process when another example of generation of the edge switching signal with reference to FIG. 17. FIG. 17 is a view illustrating a duty ratio calculation processing operation when the exemplary edge switching signal generation method is used.

The edge switching signal generation unit 20 set the value of the edge switching signal as "0" (Operation S201).

In addition, the phase determination circuit 17 performs the phase determination using the rise (Operation S202).

Subsequently, the edge switching signal generation unit 20 determines whether the number of times that the phase information is input reaches 100 (one hundred) times (Operation S203).

When it is determined that the number of times that the phase information does not reach 100 (one hundred) times (the determination result at Operation S203 is "NO"), the edge switching signal generation unit 20 goes back to Operation S202.

In contrast, when it is determined that the number of times that the phase information reaches 100 (one hundred) times (the determination result at Operation S203 is "YES"), the phase determination circuit 17 determines whether the phases are coincident with each other (Operation S204).

When it is determined that the phases do not coincident with each other (the determination result at Operation S204 is "NO"), the edge switching signal generation unit 20 sets the value of the edge switching signal as "1" (Operation S205).

In addition, the phase determination circuit 17 performs the phase determination using the fall (Operation S207).

Subsequently, the edge switching signal generation unit 20 determines whether the number of times that the phase information is input reaches 100 (one hundred) times (Operation S207).

When it is determined that the number of times that the phase information does not reach 100 (one hundred) times (the determination result at Operation S207 is "NO"), the edge switching signal generation unit 20 goes back to Operation S206.

In contrast, when it is determined that the number of times that the phase information reaches 100 (one hundred) times (the determination result at Operation S207 is "YES"), the phase determination circuit 17 determines whether the phases are coincident with each other (Operation S208).

When it is determined that the phases do not coincident with each other (the determination result at Operation S208 is "NO"), the phase determination circuit 17 goes back to Operation S201.

In the meantime, when it is determined that the phases of the rise are coincident with each other in the phase determination for rise (the determination result at Operation S204 is "YES"), the rising-signal variable-delay-setting-value holding unit 18 outputs the setting value for rise to the variable delay setting value comparison unit 13 (Operation S209).

In addition, the phase determination circuit 17 determines whether the phases of the fall are coincident with each other (Operation S210). When it is determined that the phases of the fall do not coincident with each other (the determination result at Operation S210 is "NO"), the memory interface circuit 1 goes to Operation S205.

In contrast, when it is determined that the phases of the fall are coincident with each other (the determination result at Operation S210 is "YES"), the variable delay setting value comparison unit 13 obtains the difference between the setting value for rise and the setting value for fall and outputs the obtained difference to the duty ratio calculation unit 14. The duty ratio calculation unit 14 calculates the duty ratio of the DQS signal (Operation S213) and notifies the calculated duty ratio of the DQS signal to an operator.

Further, when it is determined that the phases of the fall are coincident with each other in the phase determination for signal fall (the determination result at Operation S208 is "YES"), the falling-signal variable-delay-setting-value holding unit 19 outputs the setting value for fall to the variable delay setting value comparison unit 13 (Operation S211). Accordingly, the phase determination of the fall is completed.

In addition, the phase determination circuit 17 determines whether the phases of the rise are coincident with each other (Operation S212). When it is determined that the phases of the rise do not coincident with each other (the determination result at Operation S212 is "NO"), the memory interface circuit 1 goes to Operation S201.

In contrast, when it is determined that the phases of the rise are coincident with each other (the determination result at Operation S212 is "YES"), the variable delay setting value comparison unit 13 obtains the difference between the setting value for rise and the setting value for fall and outputs the obtained difference to the duty ratio calculation unit 14. The duty ratio calculation unit 14 calculates the duty ratio of the DQS signal (Operation S213) and notifies the calculated duty ratio of the DQS signal to an operator.

In the embodiment, two edge switching signal generating methods are described, but an edge switching signal generating method is not limited to the two edge switching signal generating methods described above as long as the setting value for rise and the setting value for fall are obtained by the edge switching signal generating method.

The phase determination circuit 17 as described above corresponds to an example of a "delay amount acquisition unit".

As described above, the memory interface circuit according to the embodiment obtains the setting value for rise and the setting value for fall using a single phase determination circuit. That is, it is possible to reduce a mounting scale of a circuit by an area occupied by one phase comparison circuit compared to the embodiment described in FIG. 2.

Further, in the above description, a configuration in which the memory controller 10 is located on a chipset 100 which is different from a chipset on which the CPU 3 is located as illustrated in FIG. 1 is described, but a hardware configuration of the information processing apparatus is not limited thereto.

Figure 18:
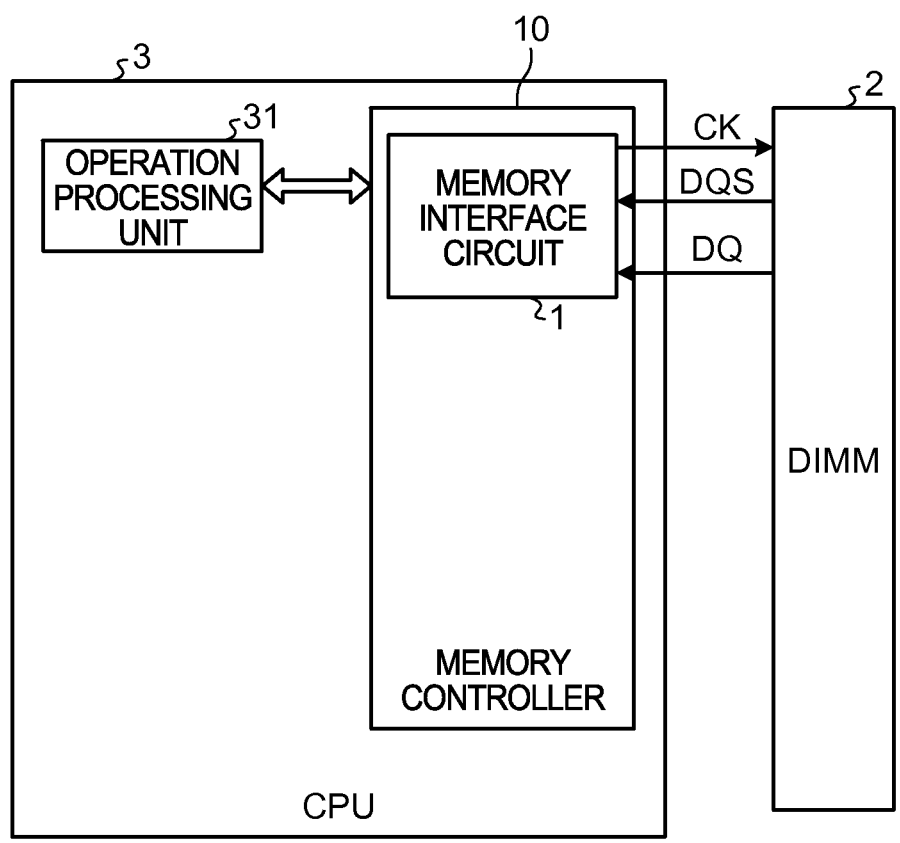
FIG. 18 is a view illustrating another exemplary hardware configuration of the information processing apparatus.

FIG. 18 is a view illustrating another exemplary hardware configuration of the information processing apparatus. The memory controller 10 provided with the memory interface circuit 1 according to each embodiment may be provided on the CPU 3 as illustrated in FIG. 18. In this case, the operation processing unit 31 and the memory controller 10 are provided on the CPU 3.

Further, in the above description, a case where the duty ratio calculation unit 14 is included in the CPU 3 is described by way of an example, the location of the duty ratio calculation unit 14 is not limited thereto. The duty ratio calculation unit 14 may be located anywhere as long as the duty ratio calculation unit 14 may receive data from the variable delay setting value comparison unit 13.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A signal control circuit, comprising:
a first delay acquisition circuit configured to acquire a first delay amount for adjusting, based on a first timing for capturing, based on a reference signal, a first delayed input signal obtained by delaying an input signal by a first rise delay amount and a second delayed input signal obtained by delaying the first delayed input signal by a second rise delay amount, a timing of a rise of the input signal and a fall or a rise of the reference signal;
a second delay acquisition circuit configured to acquire a second delay amount for adjusting, based on a second timing for capturing, based on the reference signal, a third delayed input signal obtained by delaying the input signal by a first fall delay amount and a fourth delayed input signal obtained by delaying the third delayed input signal by a second fall delay amount, a timing of a fall of the input signal and the fall or the rise of the reference signal; and
a ratio calculation circuit configured to calculate a duty ratio of the input signal based on a difference between the first delay amount and the second delay amount.

2. The signal control circuit according to claim 1, wherein the first delay acquisition circuit is configured to obtain the first delay amount such that a rise of a delayed signal formed by adding the first delay amount to the input signal is located to be aligned with the fall or the rise of the reference signal, and
the second delay acquisition circuit is configured to obtain the second delay amount such that a fall of the delayed signal formed by adding the second delay amount to the input signal, is located to be aligned with the fall or the rise of the reference signal.

3. The signal control circuit according to claim 1, wherein:
the first delay acquisition circuit is configured to obtain the first delay amount by repeatedly adding a delay amount of a first phase difference unit to the input signal, and
the second delay acquisition circuit is configured to obtain the second delay amount by repeatedly adding a delay amount of a second phase difference unit to the input signal.

4. The signal control circuit according to claim 1, further comprising an abnormality detection circuit configured to detect abnormality of a duty ratio of the input signal based on a difference between the first delay amount and the second delay amount.

5. An information processing apparatus, comprising:
an operation circuit; and
a memory controller, wherein
the memory controller includes:
a first delay acquisition circuit configured to acquire a first delay amount for adjusting, based on a first timing for capturing, based on a reference signal, a first delayed input signal obtained by delaying an input signal by a first rise delay amount and a second delayed input signal obtained by delaying the first delayed input signal by a second rise delay amount, a timing of a rise of the input signal and a fall or a rise of the reference signal,
a second delay acquisition circuit configured to acquire a second delay amount for adjusting, based on a second timing for capturing, based on the reference signal, a third delayed input signal obtained by delaying the input signal by a first fall delay amount and a fourth delayed input signal obtained by delaying the third delayed input signal by a second fall delay amount, a timing of a fall of the input signal and the fall or the rise of the reference signal, and
a data capturing circuit configured to capture data from a memory using a signal formed by adding the first delay amount to the input signal,
wherein the operation circuit includes:
an operation processing circuit configured to process data received from the data capturing circuit, and a ratio calculation circuit configured to calculate a duty ratio of the input signal based on a difference between the first delay amount and the second delay amount.

6. A duty ratio calculation method, comprising:

obtaining a first delay amount to be added to an input signal for aligning timing of a rise of the input signal with a timing of a fall or a rise of a reference signal;

obtaining a second delay amount to be added to the input signal for aligning a timing of a fall of the input signal with the timing of the fall of the reference signal; and calculating a duty ratio of the input signal based on a difference between the first delay amount and the second delay amount, wherein the first delay amount is obtained such that a rise of a delayed signal formed by adding the first delay amount to the input signal is located to be aligned with the fall or the rise of the reference signal and wherein the second delay amount is obtained such that a fall of the delayed signal formed by adding the second delay amount to the input signal is located to be aligned with the fall or the rise of the reference signal.

* * * * *